United States Patent [19]
Lautzenhiser

[11] Patent Number: 5,311,152
[45] Date of Patent: * May 10, 1994

[54] PHASE LOCKED LOOP WITH D.C. MODULATION

[75] Inventor: Lloyd L. Lautzenhiser, Nobel, Canada

[73] Assignee: Emhiser Research Limited, Ontario, Canada

[*] Notice: The portion of the term of this patent subsequent to Feb. 25, 2009 has been disclaimed.

[21] Appl. No.: 916,999
[22] PCT Filed: May 22, 1991
[86] PCT No.: PCT/US91/03602
§ 371 Date: Aug. 31, 1992
§ 102(e) Date: Aug. 31, 1992
[87] PCT Pub. No.: WO91/18444
PCT Pub. Date: Nov. 28, 1991

Related U.S. Application Data

[63] Continuation-in-part of Ser. No. 598,530 filed Oct. 16, 1990, now Patent No. 5,097,230 which is a continuation-in-part of Ser. No. 528,654 filed May 24, 1990, now Patent No. 5,091,706.

[51] Int. Cl.[5] .................... H03C 3/09; H03L 7/197
[52] U.S. Cl. ........................ 332/127; 331/23; 331/25; 332/128; 455/113
[58] Field of Search ............... 332/127, 128, 144, 146; 331/1 A, 23, 25, 30; 455/113, 119; 375/44, 120

[56] References Cited

U.S. PATENT DOCUMENTS

| | | | |
|---|---|---|---|
| 3,622,913 | 10/1969 | Shipley | 331/18 X |
| 3,805,192 | 4/1974 | Ocnaschek et al. | 332/127 |
| 4,068,198 | 1/1978 | Otto | 332/127 X |
| 4,068,199 | 1/1978 | Madoff | 331/25 X |
| 4,543,542 | 9/1985 | Owen | 332/128 |
| 4,546,331 | 10/1985 | DaSilva et al. | 332/128 |
| 4,581,749 | 4/1986 | Carney et al. | 332/128 X |
| 4,870,384 | 9/1989 | Thomas | 332/123 |

FOREIGN PATENT DOCUMENTS 0332087 9/1989 European Pat. Off.

Primary Examiner—Siegfried H. Grimm
Attorney, Agent, or Firm—Wendell E. Miller

[57] ABSTRACT

A D.C. modulated phase locked oscillator (60, 80, 100, 140, 160, 190, 220, 264, or 290) includes a phase locking oscillator (70, 90, 128, 180, 192, 222, 266, or 292) and a D.C. modulator (72, 92, 130, 156, 182, 194, 224, 268, or 294). Both a forward path (14) and a feedback path (16) are D.C. modulated. D.C. modulation of the feedback path (16) optionally includes changing the frequency in the feedback path (16) as a function of the frequency of a modulation oscillator (64), changing the frequency in the feedback path (16) by a plurality of pulses for each cycle of the modulation oscillator (64), removing pulses from the feedback path (16), adding pulses to the feedback path (16), dividing the frequency in the feedback path (16) by higher and lower dividing ratios, preventing one cycle in the feedback path (16) from developing a "high" in the feedback path (16), holding a "high" in the feedback path (16) between two adjacent pulses, mixing quadrature frequencies with the feedback frequency in the feedback path (16), changing one input to a variable modulus divider (48) by means of a parallel adder (272), and using logic elements (148) to remove pulses from the feedback path (16).

36 Claims, 17 Drawing Sheets

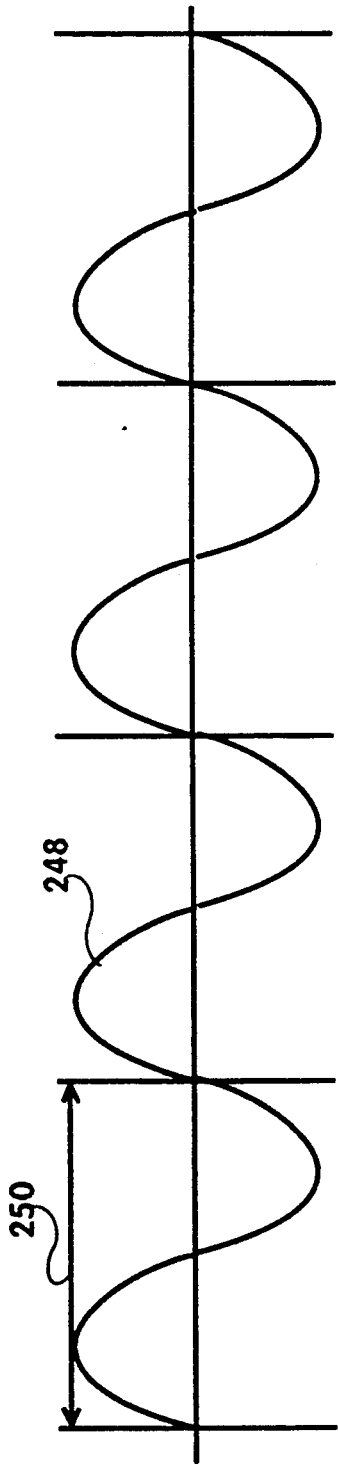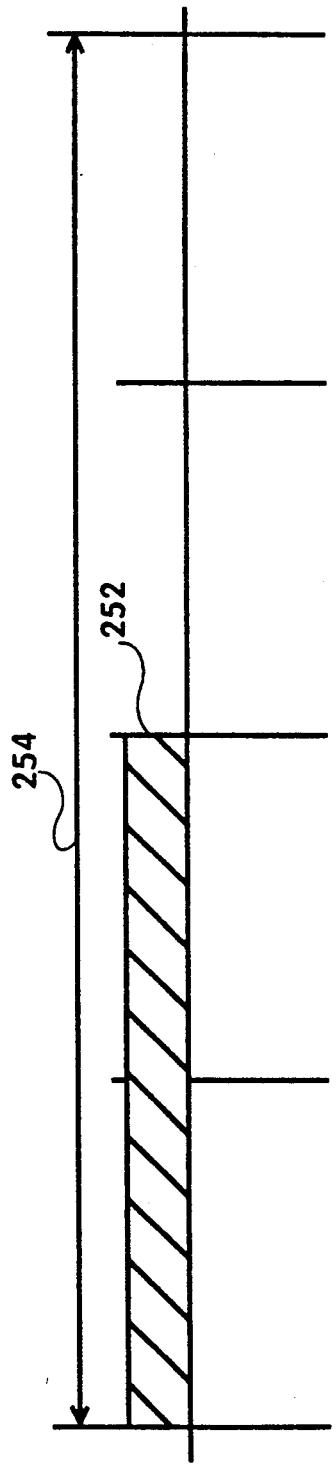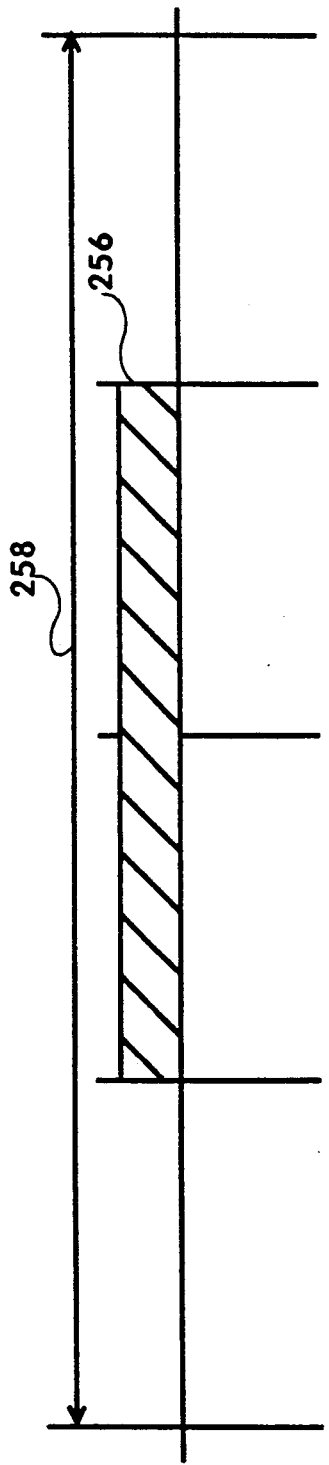

PHASE LOCKED LOOP WITH D.C. MODULATION

This patent application corresponds to International Application No. PCT/US91/03602, filed May 22, 1991, and is a Continuation-In-Part of U.S. patent application Ser. No. 07/598,530, now U.S. Pat. No. 5,097,230 which is a Continuation-In-Part of U.S. patent application Ser. No. 07/528,654, now U.S. Pat. No. 5,091,706.

TECHNICAL FIELD

The present invention relates generally to phase locked oscillators and voltage controlled crystal oscillators. More particularly, the present invention relates to a phase locked loop with D.C. modulation, and uses of the D.C. modulated phase locked loop in such electrical devices as single frequency transmitters and channelized transmitters.

BACKGROUND ART

The frequency of radio frequency voltage controlled oscillators (RF VCO) has been closely controlled by phase locking a feedback signal from the RF VCO to a crystal controlled reference oscillator (XO). A phase detector has been used to determine the phase difference between the feedback signal and a crystal controlled reference frequency; and an integrator has been used to summate the phase difference and to control the frequency of the RF VCO oscillator in accordance with the summated phase difference.

Improvements taught by the prior art over the basic phase locked oscillator include the use of prescalers to provide a feedback signal having a lower frequency than the RF VCO, thereby lowering the required frequency of the controlling circuitry. Prior art improvements over the basic circuitry also include the use of a dual modulus divider to channelize the output frequency by dividing the feedback by higher and lower dividing ratios in a technique known as pulse swallowing. That is, a pulsed signal, having a frequency proportional to the output frequency, is provided in the feedback path, and channelizing is accomplished by swallowing, or removing, pulses in the feedback path.

While phase locked oscillators have provided a frequency output that drifts very little, a significant problem has been in trying to frequency modulate the output on a D.C. basis.

One attempt at D.C. modulating the frequency output of a phase locked oscillator has been to use a voltage controlled crystal oscillator (VCXO) in place of a crystal controlled reference oscillator (XO), and to simultaneously modulate the RF VCO as well as the VCXO. The problems with this approach have been non-linearities in the VCXO, limited frequency deviation, limited frequency response of modulation, and significantly increased frequency drift as a function of both time and temperature.

In stark contrast to the limitations of the prior art, the present invention provides highly linear D.C. modulation of a RF VCO together with very little frequency drift as well as almost unlimited deviation and frequency response.

More particularly, the present invention provides both single frequency and channelized phase locked loops that are capable of D.C. modulation.

DISCLOSURE OF INVENTION

In the present invention, a D.C. modulated phase locked RF VCO includes a phase locked loop with a forward path, an RF VCO in the forward path that produces an output, a feedback path that is connected to the output, a crystal controlled reference oscillator, a phase detector that is connected to the crystal controlled reference oscillator and that is connected to both the feedback path and the forward path, and an integrator in the forward path that controls the frequency of the voltage controlled oscillator in response to integrated differences in the phase between said reference oscillator and the frequency in the feedback path.

The means for D.C. modulating the RF VCO includes a dual modulus divider that is interposed into the feedback path, and a modulation oscillator that is connected to the dual modulus divider and that causes the dual modulus divider to divide by a higher dividing ratio for each cycle of the audio oscillator. Preferably, the modulation oscillator is a voltage controlled audio oscillator (AF VCO).

Therefore, the dual modulus divider cooperates with the voltage controlled audio oscillator to remove one pulse from the feedback path for each cycle of the audio oscillator. That is, the output frequency is used to provide a pulsed signal in the feedback path that is proportional to the output frequency, and one of these pulses is removed for each cycle, or pulse, of the modulation oscillator. The RF VCO is then caused by the loop to increase its output frequency to exactly compensate for these removed pulses. The result is that the frequency of the audio frequency oscillator is added to the frequency of the oscillator. D.C. modulation of the output is therefore achieved by D.C. modulating the voltage input to the voltage controlled audio frequency oscillator.

Optionally, the RF VCO is D.C. modulated substantially simultaneously with modulating of the feedback path in order to increase the frequency response of the loop.

Further, the present invention includes means for synchronizing the changing of dividing ratios in accordance with completion of dividing at one of the ratios. In one embodiment, this means for synchronizing includes first and second flip-flops, and an OR gate. In another embodiment, this means for synchronizing includes a shift register, an OR gate, an AND gate, and an inverter. In still other embodiments the means for synchronizing includes, in addition to first and second flip flops, various ones or combinations of such elements as an AND gate, an inverter, a resistor, and a diode.

In the embodiment using the shift register, the combination of the shift register with the voltage controlled audio oscillator and the dual modulus divider provides a system in which a plurality of pulses are removed from the feedback path for each cycle of the audio oscillator.

Optionally, a prescaling divider is used in the feedback path to reduce the frequency of the feedback signal prior to dividing the feedback signal by the dual modulus divider. This addition allows a higher frequency oscillator to be similarly controlled without exceeding the frequency limitations of the dual modulus divider.

Further, the use of a prescaling divider reduces the required frequency of the audio oscillator for any given desired range of frequency modulation.

In another embodiment, suitable primarily for lower frequencies, the dual modulus divider is omitted, and a pair of bistable multivibrators, or flip-flops, are used to synchronize the modulation oscillator with the pulses in the feedback path, and a resistor and a diode are used to remove one pulse from the feedback path for each cycle of the modulation oscillator, or even to effectively remove as many as hundreds of pulses from the feedback path for each cycle of the modulation oscillator.

In still another embodiment, the means for D.C. modulating a phase locked loop includes a modulation oscillator, a pair of flip-flops, or bistable multivibrators, that are connected to the modulation oscillator and that produce two square-wave outputs that are phase shifted 90 degrees, one to the other, to produce quadrature outputs, and a quadrature phase shift keying (QPSK) mixer that is interposed into the feedback path of the phase locked loop, and that is connected to both quadrature outputs.

The QPSK mixer produces both sidebands as mixed with the frequencies in the feedback path, but attenuates the one which is higher than the frequencies in the feedback path, thereby lowering the frequencies in the feedback path as a function of the frequencies of the modulation oscillator.

Then, to keep the loop phase locked, the phase detector and the integrator cooperate to increase the voltage applied to the voltage controlled oscillator in the feedback loop, and thereby increase the output frequency of the voltage controlled oscillator.

In this embodiment also, th RF VCO is D.C. modulated substantially simultaneously with modulating of the feedback path in order to increase the frequency response of the loop.

In still another embodiment of the present invention, a dual modulus divider, having lower and higher dividing ratios, is interposed into the feedback path; a modulus controller, having "A" and "N" inputs which control the number of times that the dual modulus divider divides at each of the two dividing ratios, is connected to the dual modulus divider; a modulation oscillator, which produces modulation frequencies, is connected to a parallel adder by a synchronizer; and the parallel adder increases the "A" count of the modulus controller as a function of the frequencies of the modulation oscillator.

As the "A" count of the modulus controller is increased, an additional division is performed on the frequency in the feedback path, lowering the frequency in the feedback path, and thereby requiring that the output frequency in the forward path increase to maintain the loop in phase locked condition.

Optionally, the forward path is D.C. modulated substantially simultaneously with modulation of the feedback path, as described for the other embodiments.

In embodiments using a dual modulus divider, by changing the normal state of the dual modulus divider to divide at the higher dividing ratio, pulses are added to the feedback path rather than being removed.

The exceptionally low frequency drift of the present invention is attributable to the inherent stability of the crystal controlled reference oscillator, and the low frequency drift of the modulation oscillator which, preferably, is in the audio frequency range.

The proliferation of uses for various frequency bands has resulted in crowding of the bands, and in an accompanying need to increase the number of channels in a given band. However, the limitation in the number of channels that can be accomplished depends to some measure upon the band width that must be allocated to expected frequency drift over time and temperature.

Until recently, for military communication bands, a frequency drift of $+/-0.003$ percent was allowed, but now specifications have been tightened to allow only $+/-0.002$ percent.

Assuming a frequency drift of $+/-0.003$ percent in the 2200 to 2400 MHz band, and assuming the mid point of the band, this allowable frequency drift could result in a drift of $+/-69$ kHz or a total drift of 138 kHz.

The present invention provides transmitters in which not only are drift specifications of $+/-0.002$ percent readily attainable, but also the transmitters of the present invention can be manufactured to hold the frequency drift within $+/-0.001$ percent should this specification be further tightened.

Since the frequency drift of voltage controlled oscillators is a smaller percentage with lower frequency designs, the frequency drift of the RF VCO is reduced by dividing the feedback frequency by a larger dividing ratio and using a lower modulation frequency, even though the effect of each cycle of the modulation frequency, and the drift of the modulation oscillator, is multiplied by the dividing ratio.

However, a reduced frequency in the feedback path results in a lower frequency response of the system. The use of a shift register also reduces the required frequency of the audio oscillator; but it does not deteriorate the frequency response, as does the use of a prescaling divider.

Without regard to frequency response, in preferred embodiments the present invention provides almost instantaneous modulation of the output in response to a modulation signal, since the forward path is modulated as well as the feedback path. Therefore, while the time to phase lock is dependent upon the frequency in the feedback path, the time to D.C. modulate the output is almost instantaneous without regard to the frequency in the feedback path.

Optionally, the present invention utilizes two separate means for controlling the dual modulus divider. One of these controlling means is the D.C. modulating means of the audio frequency voltage controlled oscillator; and the other controlling means provides means for channelizing the output.

That is, the dual modulus divider is controlled to remove pulses in the feedback path to provide D.C. modulation of the output; and the dual modulus divider is separately controlled to remove pulses in the feedback path at a rate in which the output is shifted to a given frequency channel.

The synchronizer of the present invention prevents interruption of the control of the dividing ratios of the dual modulus divider by one of the controlling means while the other controlling means is controlling the dual modulus divider.

The apparatus and methods of the present invention are further described in the following aspects of the invention.

In a first aspect of the present invention, an electrical device is provided which comprises phase locking oscillator means, having a loop with a forward path that includes a comparator and a variable frequency oscillator that is operatively connected to the comparator, and with a feedback path that feeds pulses of a feedback frequency from the variable frequency oscillator back to the comparator, for producing an output that is phase locked to an input frequency, the improvement which is characterized by a source of modulation frequencies; D.C. modulator means, being operatively connected to the source of modulation frequencies and to the feedback path, for changing the frequency of the pulses in the feedback path as a function of the frequencies of the source of modulation frequencies; and means, including the D.C. modulator means, for D.C. modulating the output by an exact mathematical function of the modulation frequencies.

In a second aspect of the present invention, an electrical device is provided which comprises phase locking oscillator means, having a loop with a forward path that includes a comparator and a variable frequency oscillator that is operatively connected to the comparator, and with a feedback path that feeds pulses of a feedback frequency from the variable frequency oscillator back to the comparator, for producing an output that is phase locked to an input frequency, the improvement which is characterized by a source of modulation frequencies; D.C. modulator means, being operatively connected to the source of modulation frequencies and to the feedback path, for changing the frequency of the pulses in the feedback path as a function of the frequencies of the source of modulation frequencies; and the electrical device comprises means, being operatively connected to the feedback path, for channelizing the feedback frequency.

In a third aspect of the present invention, a method is provided for producing a phase locked output that is D.C. modulated, which method comprises providing an input frequency, using the input frequency to generate an output frequency, using the output frequency to provide a feedback frequency, comparing the feedback frequency with the input frequency, and using the comparison to phase lock the output frequency to the input frequency, the improvement which is characterized by accessing a modulation frequency; using the modulation frequency to D.C. modulate the feedback frequency; and changing the output frequency as an exact mathematical function of the modulation frequency.

In a fourth aspect of the present invention, a method is provided for producing a phase locked output that is D.C. modulated, which method comprises providing an input frequency, using the input frequency to generate an output frequency, using the output frequency to provide a feedback frequency, comparing the feedback frequency with the input frequency, and using the comparison to phase lock the output frequency to the input frequency, the improvement which is characterized by accessing a modulation frequency; using the modulation frequency to D.C. modulate the feedback frequency; and channelizing the feedback frequency.

BRIEF DESCRIPTION OF DRAWINGS

FIGS. 13a–13c are graphs of the frequency of the modulation oscillator and both first and second square waves that are developed by the pair of flip-flops and that are phase shifted, one from the other, to provide quadrature frequencies for use by the quadrature phase shift keying (QPSK) mixer of the FIG. 12 embodiment;

BEST MODES FOR CARRYING OUT THE INVENTION

Figure 1:
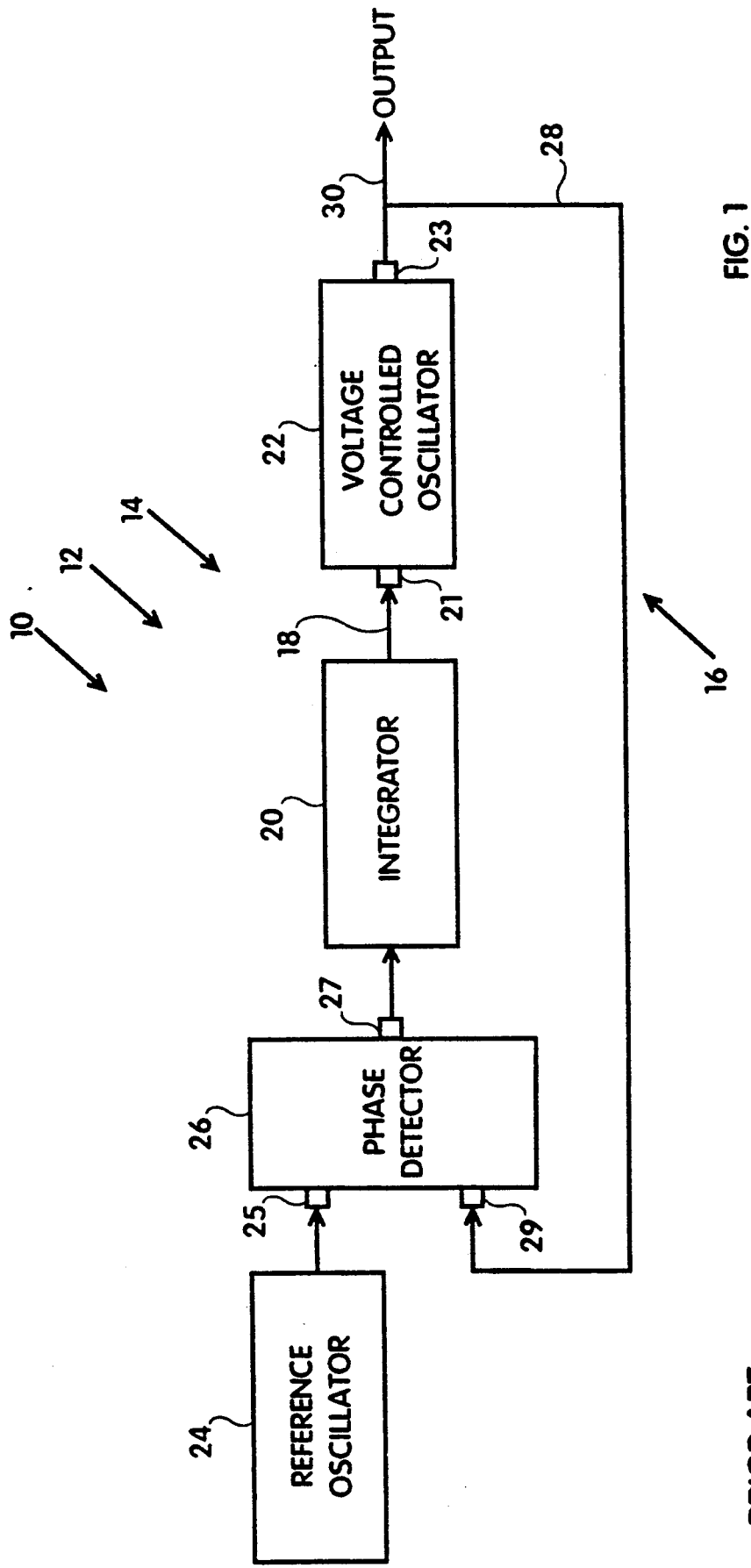
FIG. 1 is a schematic drawing of the most fundamental implementation of a prior art device in which a voltage controlled oscillator is phase locked to a reference oscillator by use of a phase detector and an integrator.

Referring now to FIG. 1, in the most basic configuration of the prior art, a phase locked oscillator 10 includes a phase locked loop 12 with both a forward path 14 and a feedback path 16. The forward path 14 includes a forward path conductor 18, and both an integrator 20 and a variable frequency oscillator, or voltage controlled oscillator, 22 that are interposed into the forward path conductor 18. The voltage controlled oscillator 22 includes both a control input 21 and an output 23; and connections in the forward path 14 included the control input 21 of the voltage controlled oscillator 22 being connected to the integrator 20 by the forward path conductor 18.

Also, the phase locked oscillator 10 includes a crystal controlled reference oscillator, or reference frequency oscillator, 24 and a phase detector, or comparator, 26. An input 25 of the phase detector 26 is connected to the crystal controlled reference oscillator 24, an output 27 of the phase detector 26 is connected to the forward path 14, and an input 29 of the phase detector 26 is connected to the feedback path 16 by a feedback conductor 28.

The output 23 of the variable frequency oscillator 22 is connected to an output conductor 30; and the output conductor 30 is connected to the feedback conductor 28. Thus, the output conductor 30 feeds back the output frequency of the variable frequency oscillator 22 as a feedback signal through the feedback conductor 28 to the input 29 of the phase detector 26. The phase detector 26 performs a time comparison between the leading edge of the phase of the feedback signal and the leading edge of the reference frequency that is supplied by the crystal controlled reference oscillator 24, and supplies this difference to the integrator 20.

The integrator 20 then controls the frequency of the voltage controlled oscillator 22 by supplying voltages thereto that are in accordance with integrated time differences between the leading edges of the phases of the feedback signal and the reference frequency. The effect is that the frequency of the output is phase locked to the frequency of the crystal controlled reference oscillator 24.

Figure 2:
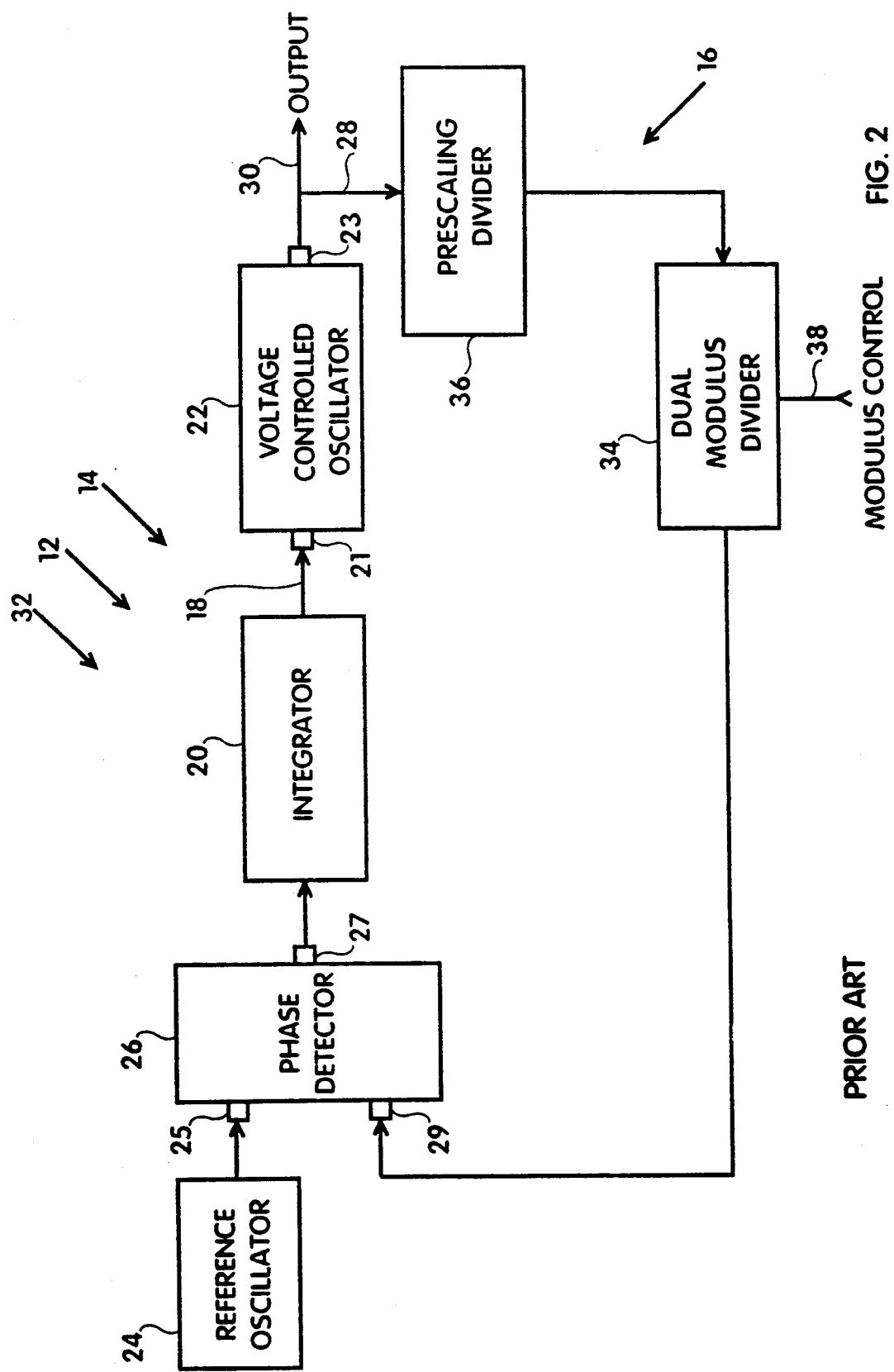
FIG. 2 is a schematic of the prior art device of FIG. 1 with a prescaling divider and a dual modulus divider added thereto.

Referring now to FIG. 2, a phase locked oscillator 32 includes like-named and like-numbered components as recited for FIG. 1, and in addition, the FIG. 2 embodiment includes a dual modulus divider 34 and a prescaling divider 36.

When the prescaling divider 36 is included in the circuitry of FIG. 2, but the dual modulus divider 34 is omitted, the output is divided by some number, perhaps sixteen, so that a feedback signal, having generally the form of a square wave, is produced whose frequency is lower than that of the output. This reduction in the frequency of the feedback signal allows the use of a crystal controlled reference oscillator 24 having a frequency that is less, in this example one-sixteenth, of the output.

In operation, assuming a dividing ratio of sixteen to one, a reduction in frequency of one cycle in the feedback path 16 requires an increase in frequency of sixteen Hertz in the output conductor 30 to phase lock the feedback path 16 to the crystal controlled reference frequency.

When the prescaling divider 36 is omitted from the schematic of FIG. 2, but the dual modulus divider 34 is included, the output frequency is divided, selectively, by two different dividing ratios, such as 40 and 41.

The dividing ratios of the dual modulus divider 34 are controlled by a signal in a modulus control conductor 38 by a modulus controller which will be shown and described in more detail in conjunction with another drawing.

By using the dual modulus divider 34, the frequency of the output can be channelized, and yet the frequency of the output will be closely controlled by the crystal controlled reference frequency, thereby avoiding frequency drift in the output, except for the small drift of the crystal (not shown) in the crystal controlled reference oscillator 24. An example of the use of the dual modulus divider to achieve channelization is included with the discussion of FIG. 3.

Figure 3:
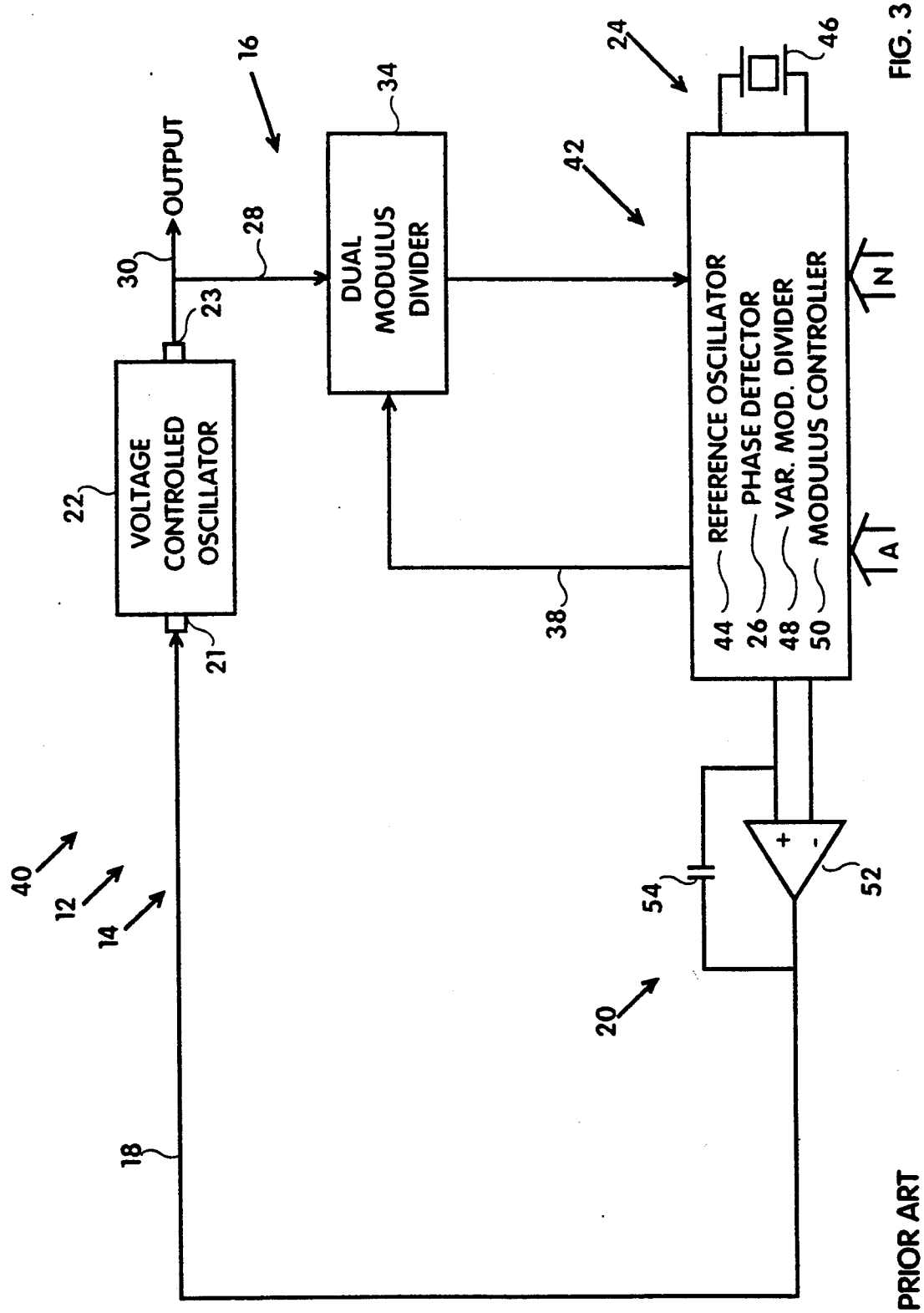
FIG. 3 is a schematic drawing of a prior art device in which an integrated chip provides several of the functions of the prior art embodiment of FIG. 2.
Figure 10:
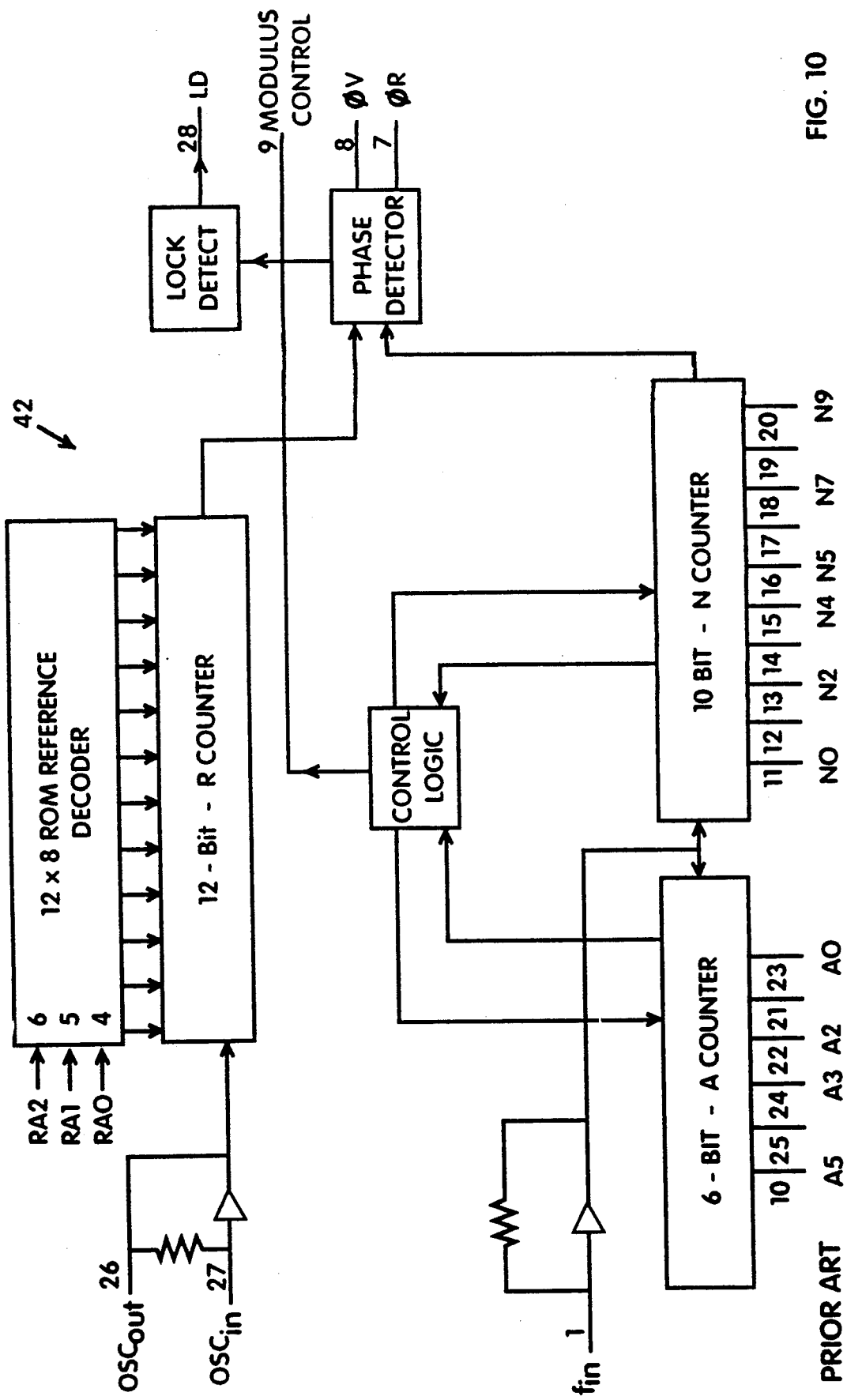
FIG. 10 is a schematic drawing of the integrated chip which is used in the embodiments of FIGS. 3, 6, 7, and 9.

Referring now to FIG. 3, in a phase locked oscillator 40 the prior art embodiment of FIG. 2 is constructed using an integrated chip 42. Preferably, the integrated chip 42 is of the type built by Motorola which is numbered 45152 by the manufacturer, and which is shown in FIG. 10.

The integrated chip 42 includes a reference oscillator 44 that cooperates with a crystal 46 to form the crystal controlled reference oscillator 24 of FIG. 2; and the chip 42 includes the phase detector 26 of FIG. 2.

The integrated chip 42 further includes a variable modulus divider 48 that controls the number of times that the dual modulus divider 34 divides by the lower dividing ratio, and divides by the higher dividing ratio; and the integrated chip 42 includes a modulus controller 50 that controls the change from the lower dividing ratio to the higher dividing ratio to correspond to completion of any given dividing step.

In the FIG. 3 embodiment, the integrator 20 of FIG. 2 consists, in simplified form, of an operational amplifier 52 and a capacitor 54.

While the prescaling divider 36 of FIG. 2 is not included in FIG. 3, it could be included if desired, and the operation of the circuity would be as described for FIG. 2.

Channelization of the output of the voltage controlled oscillator 22 by the dual modulus divider 34 is accomplished as shown in the following example.

To channelize a transmitter starting at 400 MHz with channel steps of 100 kHz: the dual modulus divider 34, with dividing ratios of 40 and 41, divides the 400 MHz output by 40 for 100 times; and a frequency of 100 kHz is fed back to the phase detector 26. With a reference oscillator 44 having a reference frequency of 100 kHz, the frequency of the voltage controlled oscillator 22 will be adjusted until the output frequency in the output conductor 30 is equal to the product of 40 times 100, times the reference frequency of the reference oscillator 24, or 40×100×100 kHz=400 MHz.

To achieve the first channelized frequency above 400 MHz, the N counter of the integrated chip 42 of FIG. 3 is set to 99 so that the dual modulus divider 34 divides by 40 for 99 times; and the A counter is set to divide by 41 once.

When the dual modulus divider 34 divides the 400 MHz by 40 for 99 times, and by 41 for one time, for the loop 12 to phase lock, the phase detector 26 and the integrator 20 must increase the frequency of the voltage controlled oscillator 22 to be equal to ×100 kHz, or 400.1 MHz.

Therefore, reducing the number of times that the dual modulus divider 34 divides by 40, and equally increasing the number of times that the dual modulus divider 34 divides by 41, results in channelization in steps of 100 kHz.

While a reference frequency of 100 kHz has been used in the above examples for ease of computation, in a preferred embodiment a reference frequency of 31,250 Hertz is used.

Figure 4:
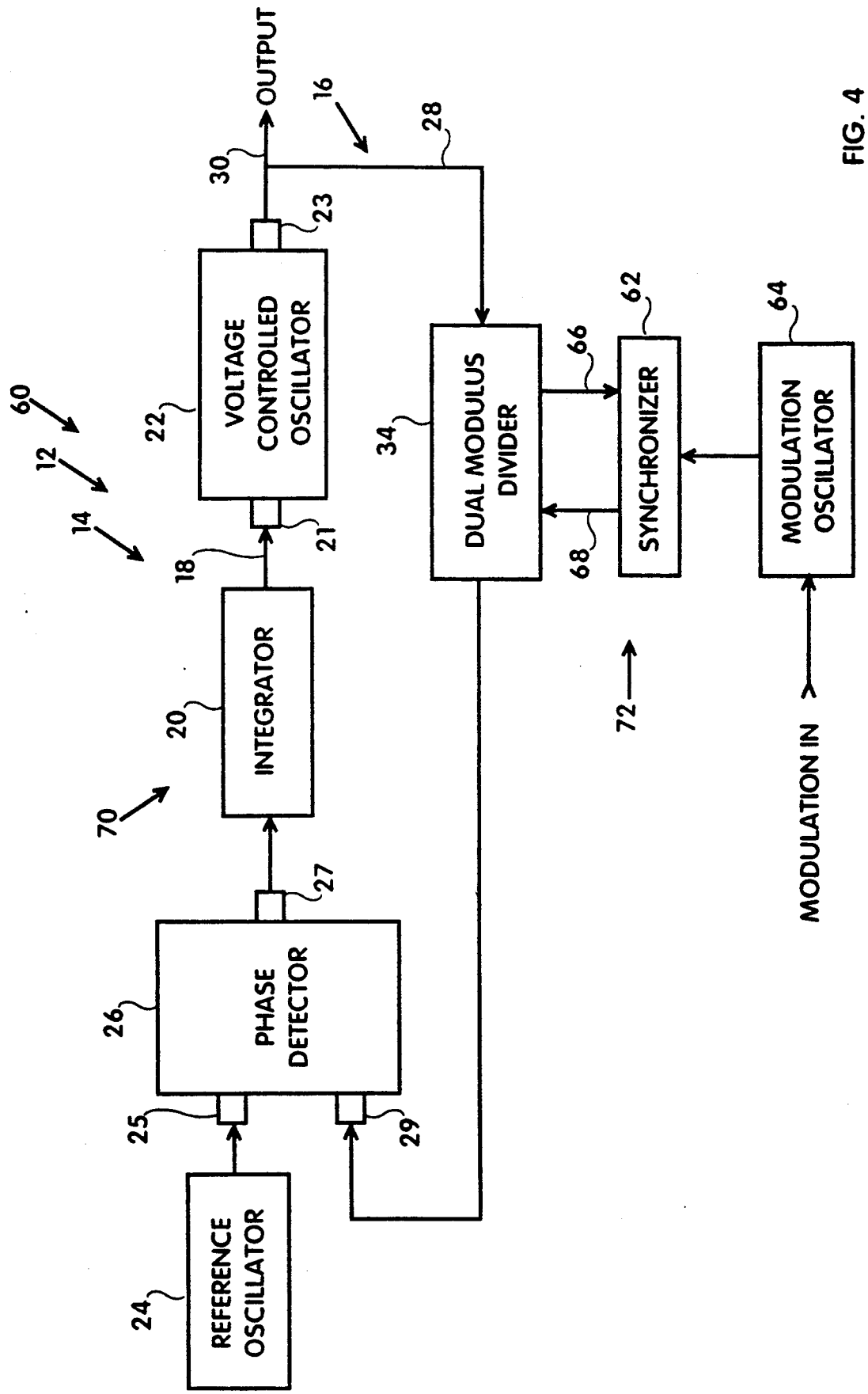
FIG. 4 is a schematic drawing of the present invention in which the feedback path of a voltage controlled oscillator is D.C. modulated by use of a dual modulus divider, a synchronizer, and a voltage controlled audio frequency oscillator.

Referring now to FIG. 4, in a first embodiment of the present invention, an electrical device, or D.C. modulated phase locked oscillator 60, includes like-named and like-numbered components as described in conjunction with FIG. 2, except that the prescaling divider 36 is omitted, and except for additional components that will be described.

In addition to like-named and like-numbered components of FIG. 2, the electrical device 60 of FIG. 4 includes a synchronizer 62 and a variable frequency oscillator, or voltage controlled oscillator, or source of modulation frequencies, 64 which will be referred to herein as a modulation oscillator, and which preferably is an audio oscillator.

In operation, the modulation oscillator 64 and the synchronizer 62 cooperate to control the dual modulus divider 34, such that for each cycle of the modulation oscillator 64, the dual modulus divider 34 divides by the higher dividing ratio.

If the dual modulus divider 34 has dividing ratios of 40 and 41, and if the modulation oscillator 64 has an output frequency of 100 Hertz, then the dual modulus divider 34 will divide the feedback signal in the feedback conductor 28 by 40, except for 100 times in any given second; and the dual modulus divider 34 will divide the feedback signal by 41 for 100 times each second.

Each time the dual modulus divider 34 divides by the higher dividing ratio, one pulse will be removed from the feedback path 16, and the phase detector 26 will cooperate with the integrator 20 and the voltage controlled oscillator 22 to increase the output frequency by one cycle. Or, as in the example of a modulation oscillator 64 operating at one hundred Hertz, one hundred pulses will be removed from the feedback path 16 each second; and the output frequency in the output conductor 30 will be increased by one hundred Hertz.

Since the modulation oscillator 64 is of the voltage controlled type and is D.C. modulated, and since the phase detector 26 and the integrator 20 cooperate to phase lock the feedback signal to the crystal controlled reference frequency, the output frequency must increase to keep the loop 12 phase locked, and the result is that the output frequency is D.C. modulated.

Since the output frequency is not only D.C. modulated, but also is crystal referenced, the present invention provides means for producing a crystal referenced output that is D.C. frequency modulated.

The D.C. frequency modulated output, being now crystal referenced, has the inherent frequency stability of a crystal; and, since the frequency of the modulation oscillator 64 is quite low, the frequency drift of the modulation oscillator 64, being a function of frequency, is also quite low. Therefore, the combined frequency drift of the crystal controlled reference oscillator 24 and the modulation oscillator 64 is extremely low.

Continuing to refer to FIG. 4, the synchronizer 62 holds a cycle received from the modulation oscillator 64 until it receives a division completion signal from a conductor 66 that connects the dual modulus divider 34 to the synchronizer 62. Then the synchronizer 62 delivers a modulus control signal to a modulus control conductor 68 that changes the dividing ratio of the dual modulus divider 34 from the lower dividing ratio to the higher dividing ratio.

It should be understood that a phase locking oscillator 70 of the FIG. 4 embodiment includes the phase locked loop 12 with both the forward path 14 and the feedback path 16, the voltage controlled oscillator 22 and the integrator 20 in the forward path 14, the crystal controlled reference oscillator 24, and the phase detector 26 that is connected to the reference oscillator 24 and to both the forward path 14 and the feedback path 16.

Further, it should be understood that a D.C. modulator 72 of the FIG. 4 embodiment includes the dual modulus divider 34, the synchronizer 62, and the modulation oscillator 64, all of which are operatively connected to the feedback path 16.

Figure 5:
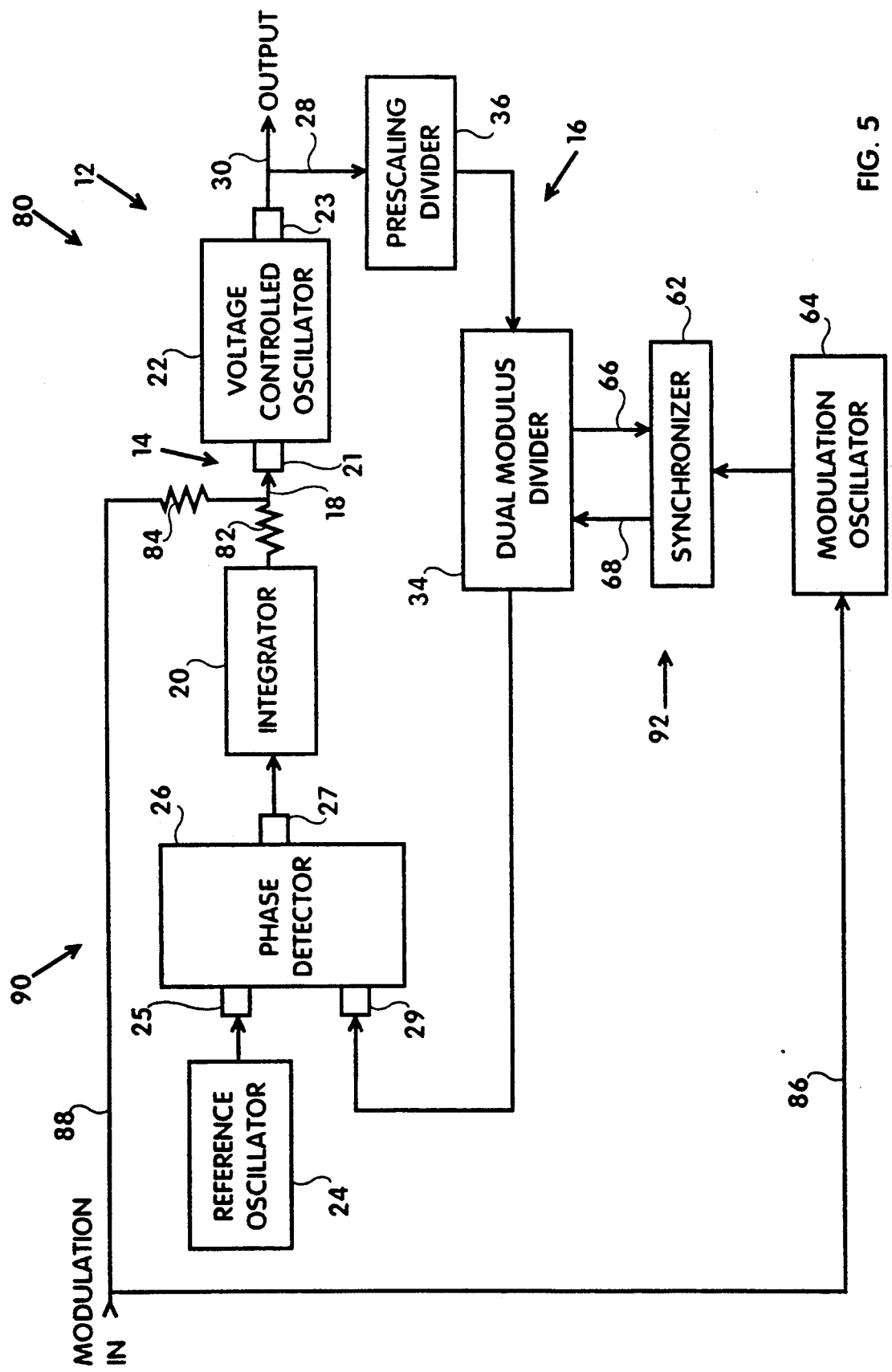
FIG. 5 is a schematic drawing of an embodiment of the present invention in which a prescaling divider and D.C. modulation of the forward path have been added to the FIG. 4 embodiment.

Referring now to FIG. 5, in a second embodiment of the present invention, an electrical device, or D.C. modulated phase locked oscillator, 80 includes like-named and like-numbered components as described in conjunction with FIG. 4. In addition, the embodiment of FIG. 5 includes the prescalling divider 36 of FIG. 2, a summing resistor 82, a summing resistor 84, a modulation conductor 86, and a modulation conductor 88. The summing resistor 82 is interposed into the forward path conductor 18; and the summing resistor 84 is interposed into the modulation conductor 88.

The operation of the FIG. 5 embodiment is similar to that described for FIG. 4. The primary difference is that both the forward path 14 and the feedback path 16 are modulated. That is, both the modulation oscillator 64 and the voltage controlled oscillator 22 are D.C. modulated.

The modulation conductor 86 conducts a D.C. modulation signal to the modulation oscillator 64; and the modulation conductor 88 conducts the modulation signal to the voltage controlled oscillator 22 through the summing resistor 84.

The difference in the phase of the frequency of the feedback signal in the feedback path 16 and the phase of the reference frequency of the crystal controlled reference oscillator 24 produces an error signal that is fed to the integrator 20, the integrator 20 feeds an integrated error signal to the summing resistor 82, a modulation signal is fed to the summing resistor 84, and the signals to the summing resistors 82 and 84 are algebraically added to control the frequency of the voltage controlled oscillator 22.

If the feedback path 16 were not modulated so that only the modulation signal of the modulation conductor 88 were connected to the voltage controlled oscillator 22, the phase locking of the loop 12 would cancel the frequency modulation of the output. Therefore, the frequency of the output could be A.C. modulated only, and then only if the modulation frequency were higher than the natural frequency of the loop 12.

If only the feedback path 16 is modulated, as in FIG. 4, D.C. frequency modulation of the output is achieved, but the frequency response is limited by the natural frequency of the loop 12.

Then, to achieve frequency modulation of the output, the phase detector 26 must sense the difference in the frequency between the feedback path 16 and the frequency of the crystal controlled reference oscillator 24, the integrator 20 must integrate the phase differences, the frequency of the voltage controlled oscillator 22 must be changed in accordance with the integrated phase differences, and the phase detector 26 must phase lock the feedback path 16 to the reference frequency of the crystal controlled reference oscillator 24.

However, in the FIG. 5 embodiment, both the forward path 14 and the feedback path 16 are modulated substantially simultaneously, thereby achieving not only D.C. modulation of the output, but also essentially unlimited frequency response.

Referring again to FIG. 5, the inclusion of both the prescaling divider 36 and the dual modulus divider 34 decreases the required frequency of the crystal controlled reference oscillator 24, and decreases the required frequency of the modulation oscillator 64. While reducing the required frequency of the modulation oscillator 64 is advantageous in that the frequency of the modulation oscillator 64 is lowered, and the frequency drift thereof is reduced, the phase locking time is increased as the feedback frequency is decreased.

It should be understood that a phase locking oscillator 90 of the FIG. 5 embodiment includes the phase locked loop 12 with both the forward path 14 and the feedback path 16, the voltage controlled oscillator 22 and the integrator 20 in the forward path 14, the prescaling divider 36 in the feedback path 16, the crystal controlled reference oscillator 24, and the phase detector 26 that is connected to the reference oscillator 24 and to both the forward path 14 and the feedback path 16.

Further, it should be understood that a D.C. modulator 92 of the FIG. 5 embodiment includes the dual modulus divider 34, the synchronizer 62, and the modulation oscillator 64, all of which are operatively connected to the feedback path 16; and the D.C. modulator 92 further includes the summing resistors, 82 and 84, and the modulation conductors, 86 and 88.

Figure 6:
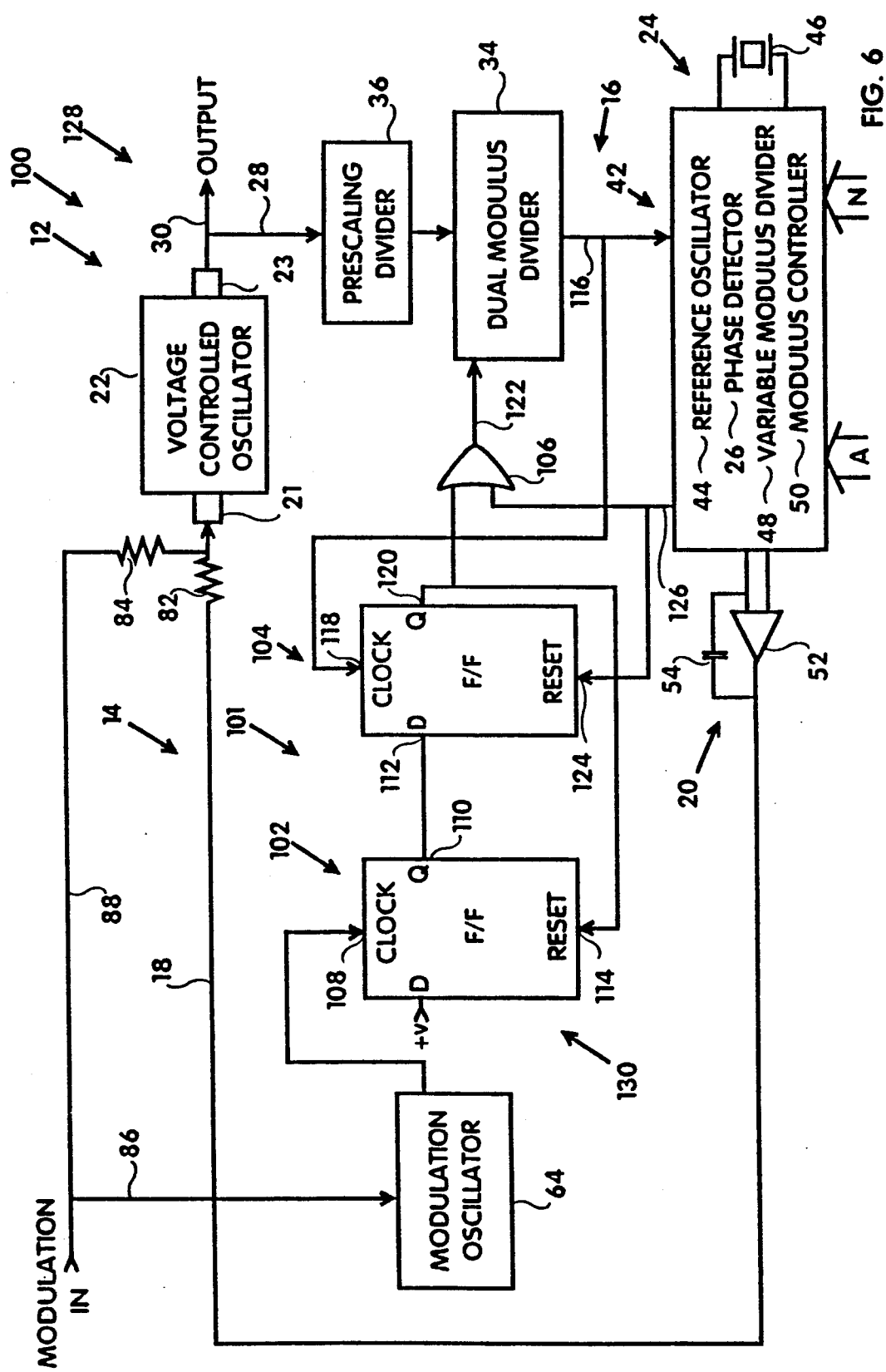
FIG. 6 is a schematic drawing of the present invention in which the synchronizer includes two flip-flops and an OR gate, some of the components of FIGS. 4 and 5 are included in an integrated chip, and the dual modulus divider provides channelization as well as cooperating with the audio frequency oscillator to provide D.C. modulation.

Referring now to FIG. 6, in a third embodiment of the present invention, an electrical device, or D.C. modulated phase locked oscillator, 100 includes likenamed and like-numbered components as described in conjunction with FIGS. 1-4.

The electrical device 100 of FIG. 6 produces a crystal referenced output that is D.C. modulated, as has been described for the FIG. 5 embodiment, and the device 100 provides substantially simultaneous modulation of both the forward path 14 and the feedback path 16, also as described for the FIG. 5 embodiment.

In addition, the electrical device 100 of FIG. 6 provides channelization of the output frequency as well as D.C. modulation of the output frequency.

Both D.C. modulation and channelization of the output frequency are achieved by controlling the dual modulus divider 34 by two separate means.

More particularly, channelization is achieved by controlling the dual modulus divider 34 by the variable modulus divider 48 and the modulus controller 50 in the integrated chip 42: and D.C. modulation is achieved by controlling the dual modulus divider 34 by the modulation oscillator 64.

The function of the synchronizer 62 of FIG. 4 is achieved in FIG. 6 by a synchronizer 101 which consists of first and second flip-flops, or first and second logic elements, 102 and 104, that provide logic functions, and an OR gate 106.

When a cycle, or pulse removing signal, is delivered to a clock terminal 108 of the flip-flop 102 by the modulation oscillator 64, an output terminal, or Q terminal, 110 is energized, thereby energizing an input terminal, or D terminal, 112 of the flip-flop 104. The pulse removing signal from the modulation oscillator 64 is held by the flip-flop 102 until the flip-flop 102 is reset by a signal to a reset terminal 114.

Assuming that the dual modulus divider 34 has been dividing the feedback signal in the feedback path 16 by one or the other of the dividing ratios, when the dual modulus divider 34 has finished performing a dividing operation which is done to achieve channelization, a pulse in a conductor 116 is directed to a clock terminal 118 of the flip-flop 104 and to the modulus controller 50 of the integrated chip 42.

With energizing of the clock terminal 118, a modulus control signal is sent from a Q terminal, or output terminal, 120 of the flip-flop 104 to the dual modulus divider 34 via the OR gate 106 and a modulus control conductor 122, thereby changing the dividing ratio of the dual modulus divider 34 from the lower dividing ratio to the higher dividing ratio for one dividing cycle, and thereby removing one pulse from the feedback path 16.

Completion of the next dividing cycle sends a signal in the conductor 116 to the modulus controller 50; and the modulus controller 50 sends a reset signal to a reset terminal 124 of the flip-flop 104 via a modulus control conductor 126, and sends a modulus control signal to the dual modulus divider 34 via the modulus control conductor 126, the OR gate 106, and the modulus control conductor 122.

Also, as a signal is sent from the Q terminal 120 of the flip-flop 104 to the OR gate 106 and to the dual modulus divider 34, a reset signal is sent from the Q terminal 120 of the flip-flop 104 to the reset terminal 114 of the flip-flop 102, thereby resetting the flip-flop 102.

Thus, it can be seen that a synchronizer 101, consisting of the flip-flops, 102 and 104, and the OR gate 106, cooperates with the modulus controller 50 to prevent simultaneous control of the dual modulus divider 34 by the variable modulus divider 48, which provides channelization of the output frequency, and simultaneous control of the dual modulus divider 34 by the modulation oscillator 64 which provides D.C. modulation of the output frequency of the electrical device 100.

It should be understood that, in the FIG. 6 embodiment, the electrical device, or D.C. modulated phase locked oscillator, 100 includes a phase locking oscillator 128 for producing a phase locked output, and a D.C. modulator 130 for D.C. modulating the output frequency of the phase locking oscillator 128.

Also, it should be understood that the phase locking oscillator 128 of the FIG. 6 embodiment includes the phase locked loop 12 with both the forward path 14 and the feedback path 16, the voltage controlled oscillator 22, the operational amplifier 52 and the capacitor 54 which cooperate to provide the integrator 20, the prescaling divider 36, the crystal 46, and the integrated chip 42.

The portions of the integrated chip 42 that are included in the phase locking oscillator 128 are: the reference oscillator 44 which cooperates with the crystal 46 to provide the crystal controlled reference oscillator 24, the phase detector 26, the variable modulus divider 48, and the modulus controller 50.

Finally, it should be understood that the D.C. modulator 130 of the FIG. 6 embodiment includes the dual modulus divider 34, the flip-flops, 102 and 104, and the OR gate 106 which function as the synchronizer 101, and the modulation oscillator 64, all of which are operatively connected to the feedback path 16. The D.C. modulator 130 of FIG. 6 also includes the summing resistors, 82 and 84, and the modulation conductors, 86 and 88.

As stated above, the dual modulus divider 34 is a part of the D.C. modulator 130; but also, the dual modulus divider 34 is a part of the phase locking oscillator 128 as the dual modulus divider 34 cooperates with the variable modulus divider 48 and the modulus controller 50 to provide channelization of the phase locking oscillator 128.

Figure 7:
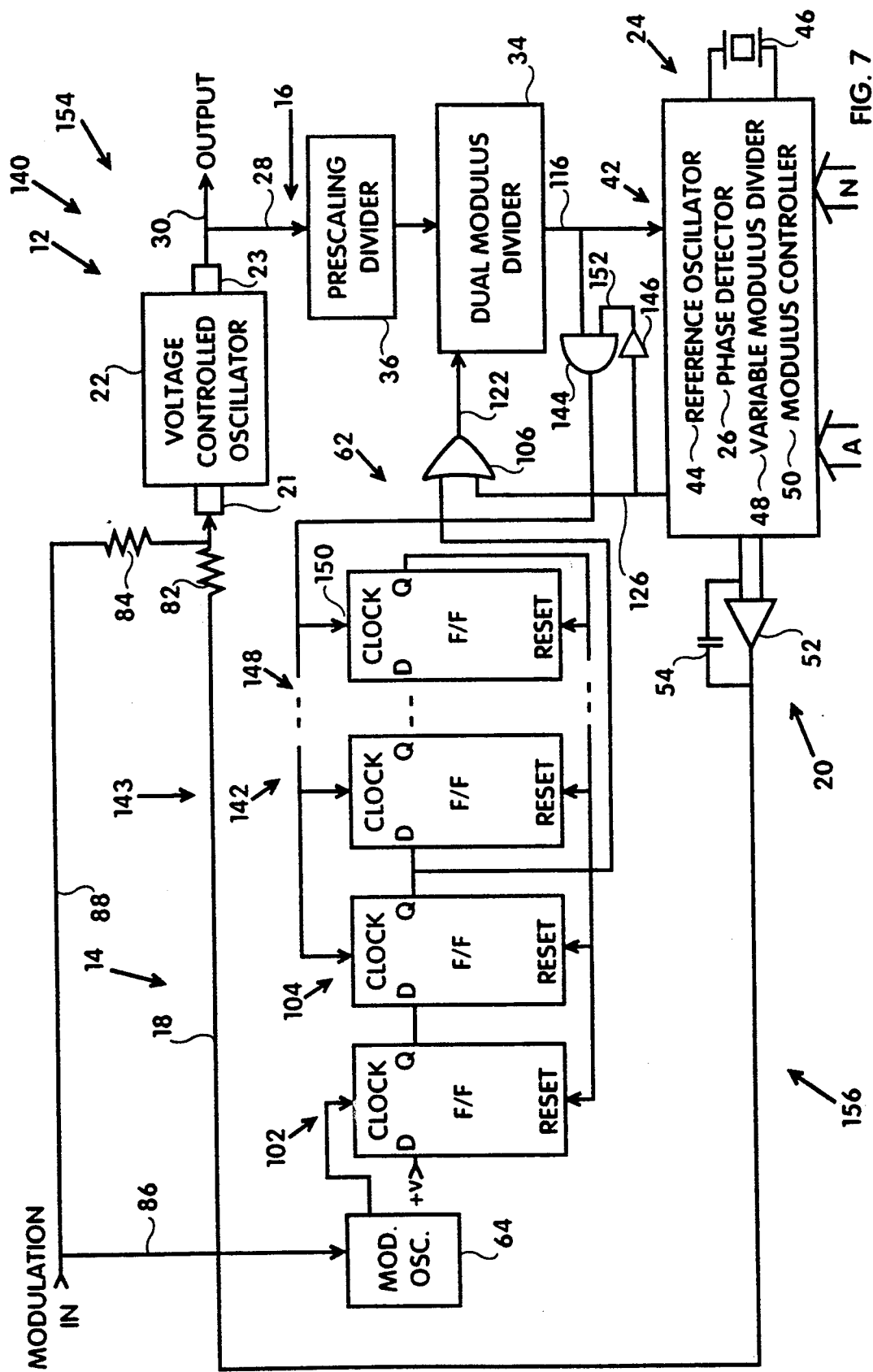
FIG. 7 is a schematic drawing of the present invention in which a shift register is added to the FIG. 6 embodiment to remove a plurality of pulses from the feedback path for each cycle of the modulation oscillator.

Referring now to FIG. 7, in a fourth embodiment of the present invention, an electrical device, or D.C. modulated phase locked oscillator, 140 includes a shift register 142 in a synchronizer 143 in addition to the flip-flops, 102 and 104. Further, the synchronizer 143 of the FIG. 7 embodiment includes the OR gate 106, an AND gate 144, and an inverter 146.

More specifically, the shift register 142 includes the flip-flops, 102 and 104, for achieving the synchronizing functions, and any desired number of flip-flops, or logic elements, 148 that provide logic functions and which cooperate with each other to remove more than one pulse from the feedback path 16 for each cycle of the modulation oscillator 64.

Thus, the shift register 142 provides means for removing a plurality of pulses from the feedback path 16 for each cycle of the modulation oscillator 64. Therefore, the shift register 142 allows the frequency of the modulation oscillator 64 to be relatively low for a given range of frequency modulation of the output, and yet allows the frequency of the crystal controlled reference oscillator 24 to remain relatively high, thereby assuring rapid phase locking together with an adequate range of frequency modulation.

Further, the shift register 142, in allowing the frequency of the modulation amplifier to be quite low, keeps the frequency drift of the modulation oscillator 64 extremely low, so that the combined drift of the modulation oscillator 64 and the crystal controlled reference oscillator 24 are only a fraction of prior art designs.

The operation of the electrical device, or D.C. modulated phase locked oscillator, 140 of FIG. 7 differs from the operation of the FIG. 6 embodiment primarily in the multiple pulse removing of the shift register 142, and in circuitry that is added to inhibit a clock terminal 150 of the shift register 142 when there is conflict between control of the dual modulus divider 34 by the modulus controller 50, and control of the dual modulus divider 34 by the shift register 142.

More particularly, the clock terminal 150 of the shift register 142 is inhibited by the AND gate 144 and the inverter 146 from receiving a signal from the conductor 116, except when a signal provided by the inverter 146 in a conductor 152 is applied to the AND gate 144 simultaneously with a signal in the conductor 116 from the dual modulus divider 34.

It should be understood that, in the FIG. 7 embodiment, the D.C. modulated oscillator 140 includes a phase locking oscillator 154 for producing a phase locked output, and a D.C. modulator 156 for D.C. modulating the output frequency of the phase locking oscillator 154.

Also, it should be understood that the phase locking oscillator 154 of the FIG. 7 embodiment includes the phase locked loop 12 with both the forward path 14 and the feedback path 16, the voltage controlled oscillator 22, the operational amplifier 52 and the capacitor 54 which cooperate to provide the integrator 20, the crystal 46, and the integrated chip 42.

Portions of the integrated chip 42 that are included in the phase locking oscillator 154 are the reference oscillator 44 which cooperates with the crystal 46 to provide the crystal controlled reference oscillator 24, the phase detector 26, the variable modulus divider 48, and the modulus controller 50.

Further, it should be understood that the D.C. modulator 156 of the FIG. 7 embodiment includes the dual modulus divider 34, the shift register 142 which cooperates with the OR gate 106, the AND gate 144, and the inverter 146 to function as the synchronizer 143, and the modulation oscillator 64, all of which are operatively connected to the feedback path 16. The D.C. modulator 156 of FIG. 7 also includes the summing resistors, 82 and 84, and the modulation conductors, 86 and 88.

The dual modulus divider 34 functions as a part of the D.C. modulator 156 to achieve D.C. modulation of the output frequency, and also functions as a part of the phase locking oscillator 154 to provide channelization of the phase locking oscillator 154.

Figure 8:
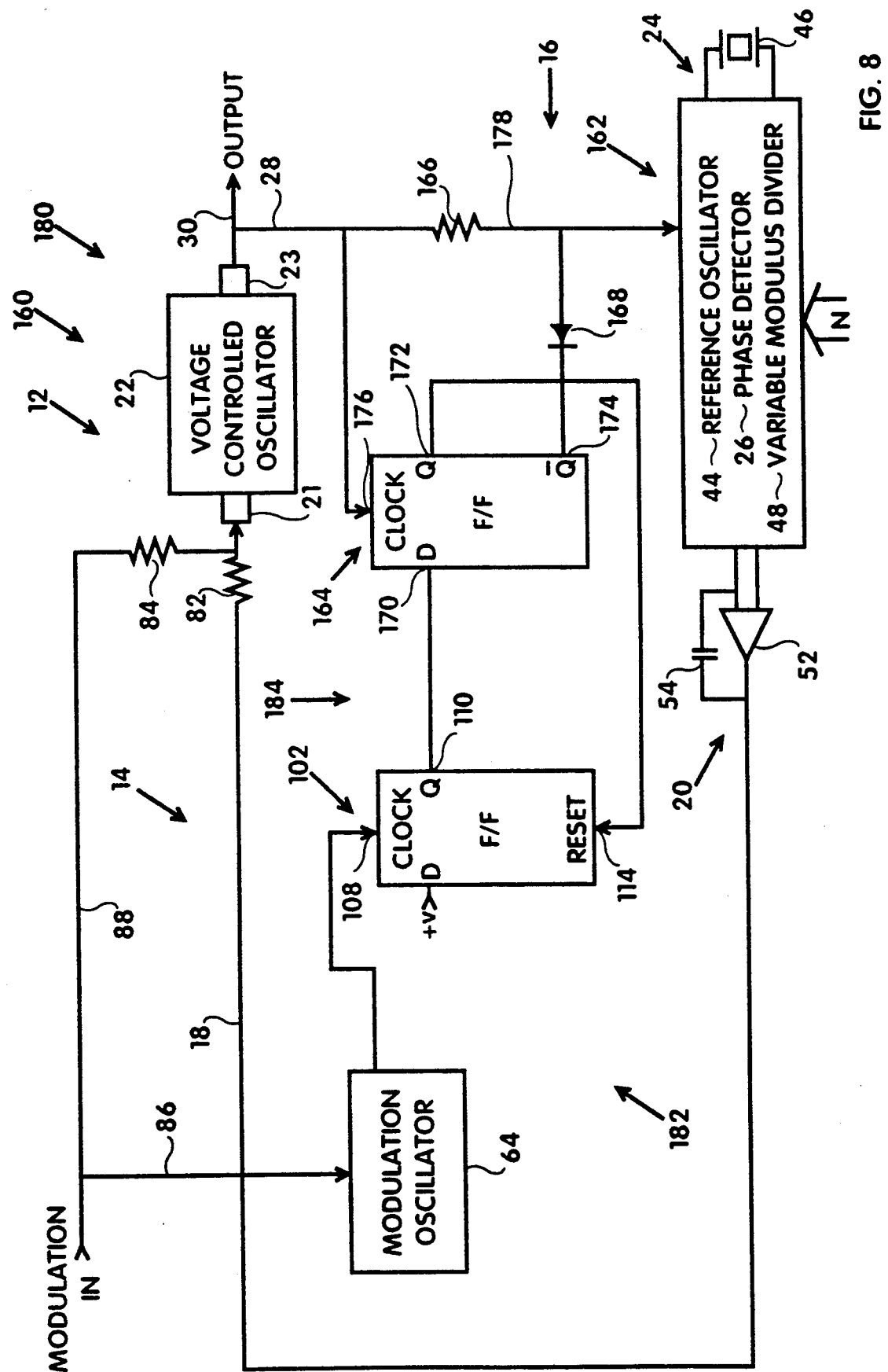
FIG. 8 is a schematic drawing of the present invention in which pulses are removed from the feedback path by a resistor and a diode rather than by a dual modulus divider as in FIGS. 4–7.

Referring now to FIG. 8, an electrical device, or D.C. modulated phase locked oscillator, 160 includes components generally as named, numbered, and described in conjunction with the embodiment of FIG. 6.

However, the electrical device 160 of FIG. 8 does not include the prescaling divider 36, the dual modulus divider 34, the flip-flop 104, the integrated chip 42, or the OR gate 106 of the FIG. 6 embodiment.

Figure 11:
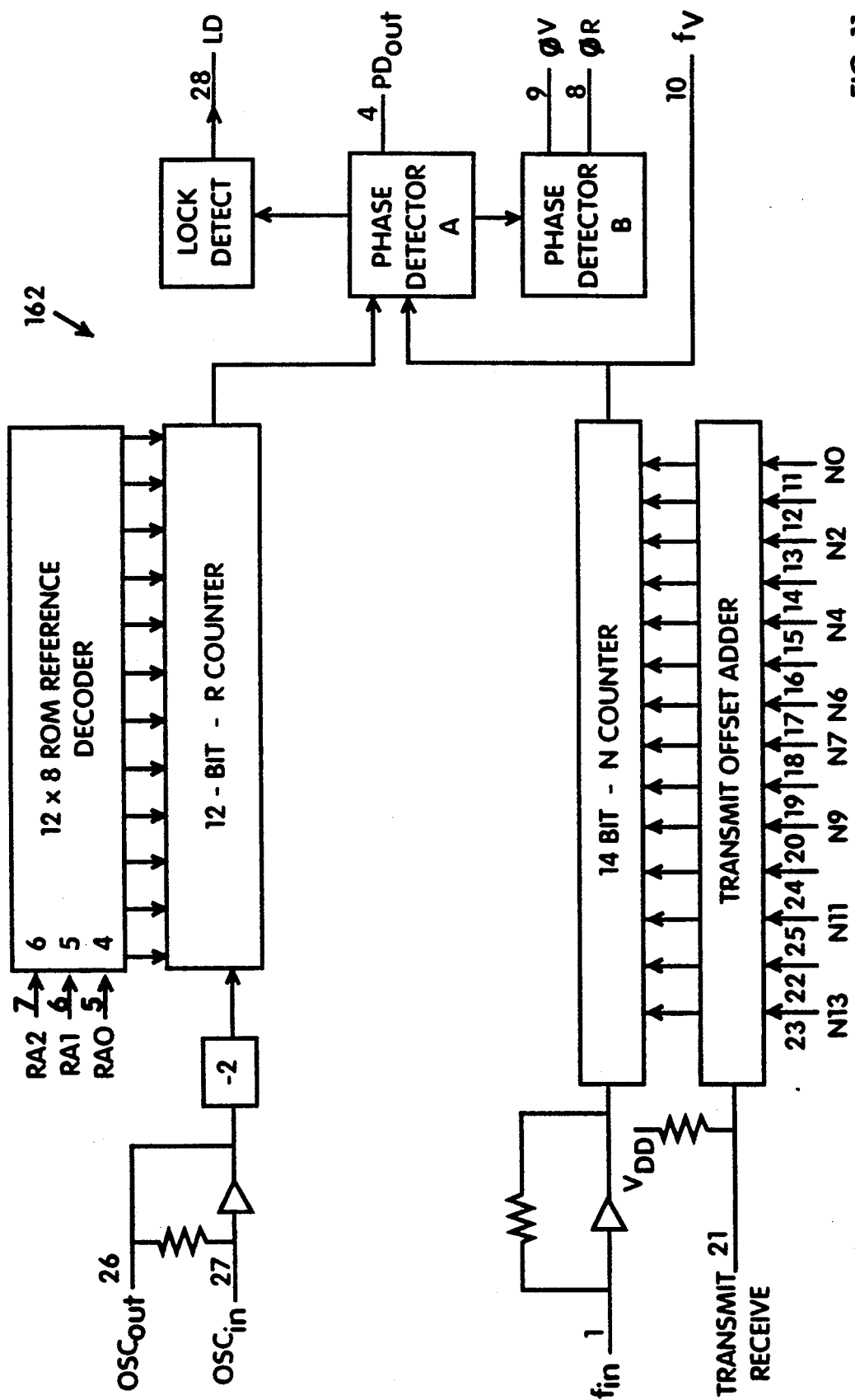
FIG. 11 is a schematic drawing of the integrated chip which is used in the embodiment of FIG. 8.

Instead, the electrical device 160 of FIG. 8 includes an integrated chip 162, a second flip-flop, or second logic element, 164 that provides a logic function, a resistor 166, and a diode 168. The integrated chip 162 is of the type manufactured by Motorola under the number 45151 which is shown in FIG. 11. The integrated chip 162 includes the reference oscillator 44, the phase detector 26, and the variable modulus divider 48, all of which function as described for the integrated chip 42. The flip-flop 164 includes a D input terminal 170, a Q output terminal 172, a NOT-Q output terminal 174, and a clock terminal 176.

In operation, when the flip-flop 164 is in the unclocked state, the NOT-Q output terminal 174 is high, and the diode 168 prevents this high from reaching a feedback conductor 178, so that all pulses from the output conductor 30 are fed back to the integrated chip 162.

However, when the modulation oscillator 64 produces a pulse, the flip-flop 102 is clocked, thereby producing a high at the output terminal 110 which is delivered to the input terminal 170 of the flip-flop 164. When the next pulse from the output conductor 30 and the feedback conductor 28 is applied to the clock terminal 176 of the flip-flop 164, the flip-flop 164 is clocked to the state wherein the Q output terminal 172 is high and the NOT-Q output terminal 174 is low. With the NOT-Q output terminal 174 low, the pulse delivered to the feedback conductor 28 is pulled down by the resistor 166 and the connection of the conductor 178 to the low of the NOT-Q output terminal 174 via the diode 168.

At substantially the same time, the flip-flop 164, being clocked by the output pulse at the clock terminal 176, delivers a high from the output terminal 172 to the reset terminal 114 of the flip-flop 102, thereby resetting the flip-flop 102 for receiving the next pulse from the modulation oscillator 64.

Therefore, for each pulse of the modulation oscillator 64, one pulse is removed from the feedback path 16. That is, one pulse is dissipated, or prevented from reaching, the integrated chip 162; and the phase detector 26 cooperates with the integrator 20 to increase the output frequency of the voltage controlled oscillator 22 to increase the output frequency by one Hertz.

It should be understood that the electrical device 160 includes a phase locking oscillator 180 and a D.C. modulator 182. The phase locking oscillator 180 includes the voltage controlled oscillator 22, the crystal controlled reference oscillator 24, the phase detector 26, and the variable modulus divider 48. The D.C. modulator 182 includes the modulation oscillator 64, the flip-flops 102 and 164, the resistor 166, the diode 168, and the resistors 82 and 84. Further, the flip-flops 102 and 164 cooperate with the diode 168 and the resistor 166 to provide a synchronizer 184.

Figure 9:
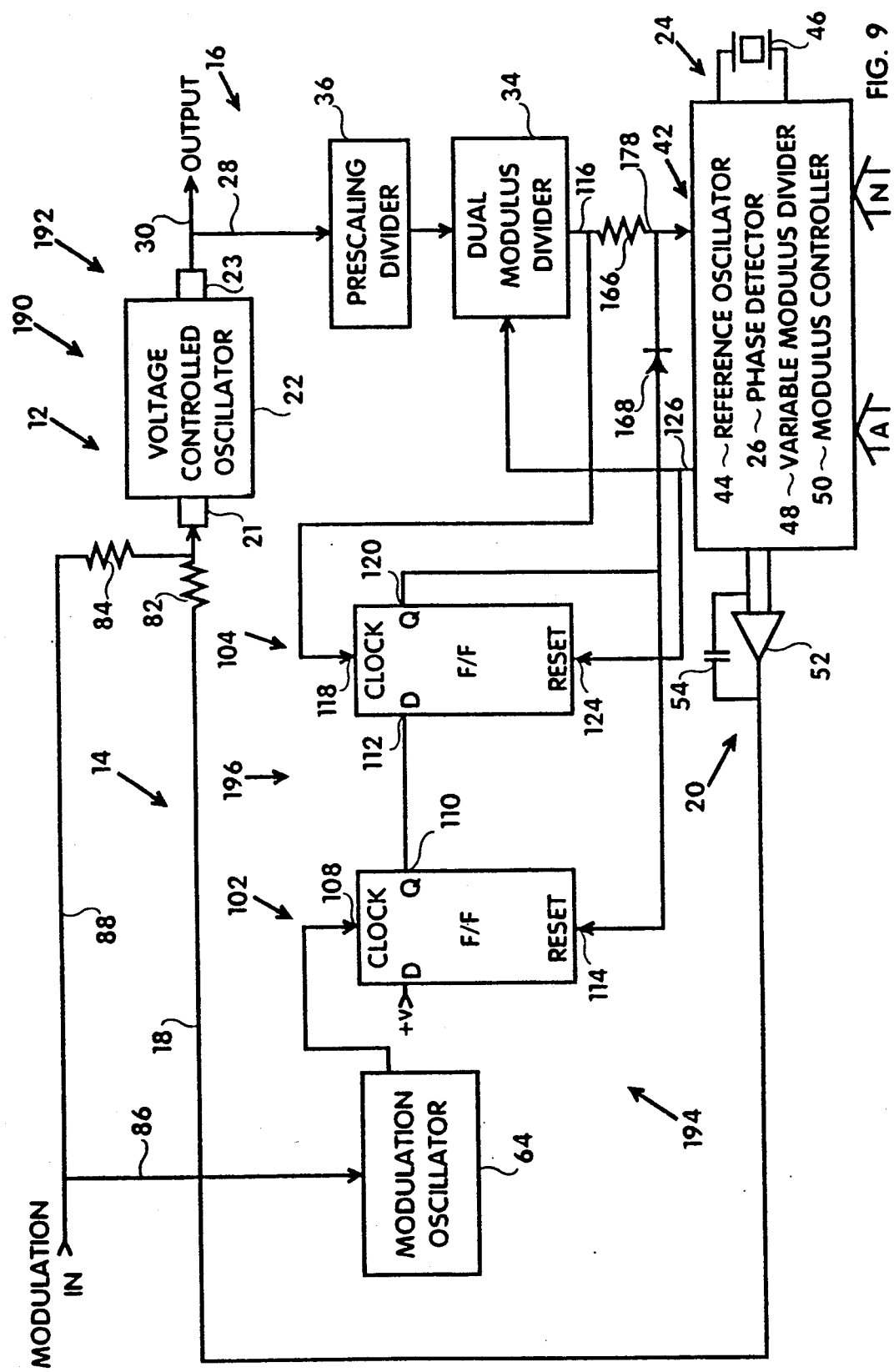
FIG. 9 is a schematic drawing of the present invention in which a resistor and a diode are used in conjunction with a dual modulus divider to achieve extremely wide frequency modulation of a phase locked output.

Referring now to FIG. 9, an electrical device, or D.C. modulated phase locked oscillator, 190 includes components generally as named, numbered, and described in conjunction with the embodiment of FIG. 6.

However, the electrical device 190 of FIG. 9 does not include the OR gate 106 of the FIG. 6 embodiment. Instead, the electrical device 190 of FIG. 9 includes the resistor 166 and the diode 168 of FIG. 8.

In operation, when the flip-flop 104 is in the unclocked state, the diode 168 blocks current flow to the output terminal 120; and the circuitry functions as described for FIG. 6.

However, when the modulation oscillator 64 produces a pulse, the flip-flop 102 is clocked, producing a high at the output terminal 110 and energizing the input terminal 112 of the flip-flop 104. Then, when the dual modulus divider 34 finishes a division by one of the dual dividing ratios, it delivers a pulse to the conductor 116, clocking the flip-flop 104.

With the flip-flop 104 clocked, a high is produced at the output terminal 120 of the flip-flop 104; and this high at the output terminal 120 is used to reset flip-flop 102 in preparation for another pulse from the modulation oscillator 64.

In addition, this high from the output terminal 120 is delivered to the conductor 178, making the conductor 178 high. With the output terminal 120 connected to the conductor 178 through the diode 168, and with the resistor 166 being interposed between the conductors 178 and 116, the conductor 178 is kept high as the conductor 116 goes low between pulses.

The result is, by preventing a low in the conductor 178 between two pulses delivered to the conductor 116 by the dual modulus divider 34, two pulses are combined into one; and in effect, one pulse is removed from the feedback path 16 in the conductor 178.

Removing one pulse from the conductor 178 effectively removes a number of pulses from the feedback path 16 that is equal to the dividing ratio of the prescaling divider 36 times the lower dividing ratio of the dual modulus divider 34.

For instance, if the prescaling divider 36 has a dividing ratio of 16, and if the lower dividing ratio of the dual modulus divider 34 is 20, then each pulse of the modulation oscillator 64 removes 16 times 20, or 320 pulses from the feedback path 16. Therefore, to increase the output of the voltage controlled oscillator 22 by 10 MHz, the required frequency of the modulation oscillator 64 would be 31,250 Hertz.

Notice that in this manner extremely wide frequency deviations can be achieved. This is, of course, at the expense of increased drift since the modulation oscillator drift is multiplied by the ratio shown above, that is, 320. In the example shown, a typical drift of 30 kHz at the output could be caused by the drift of the modulation oscillator 64 when multiplied by 320. This drift is still well within the drift allowed from transmitters which would use this wider deviation capability.

The electrical device 190 of FIG. 9 provides a much greater frequency deviation for a given frequency of the modulation oscillator 64 than does the electrical device 140 of FIG. 7, since a counter or a shift register, such as the shift register 142, removes only a small number of plurality of pulses from the feedback path 16 for each pulse of the modulation oscillator 64. More specifically, if the shift register 142 removes 10 pulses from the feedback path 16 for each cycle of the modulation oscillator 64, the electrical device 190, in removing 320 pulses from the feedback path 16 for each cycle of the modulation oscillator 64, removes 32 times as many pulses from the feedback path 16 for each cycle of the modulation oscillator 64.

Further, as previously noted, since the frequency drift of a voltage controlled oscillator, such as the modulation oscillator 64, is smaller, as a percentage of output frequency, for lower frequencies, the total drift of the D.C. modulated oscillator 190 as described herein is less when a plurality of pulses are removed from the feedback path 16 for each cycle of the modulation oscillator 64, and the frequency of the modulation oscillator 64 is reduced.

The pulse removal, or pulse combining, as described in conjunction with FIG. 9, must be prohibited when the dual modulus divider 34 is in the higher mode to prevent an incorrect output frequency. To prevent the pulse removing function from removing a pulse resulting from division at the higher dividing ratio, the modulus control conductor 126 is connected to the flip-flop 104 in addition to being connected to the dual modulus divider 34. This connection of the modulus control conductor 126 to the flip-flop 104 provides synchronization of the modulating and dividing functions as described previously.

It should be understood that the electrical device 190 of FIG. 9 includes a phase locking oscillator 192 and a D.C. modulator 194. The phase locking oscillator 192 includes the voltage controlled oscillator 22, the crystal controlled reference oscillator 24, the phase detector 26, the variable modulus divider 48, and the modulus controller 50. The D.C. modulator 194 includes the modulation oscillator 64, the flip-flops 102 and 104, the resistor 166, the diode 168, and the resistors 82 and 84. A synchronizer 196 of the FIG. 9 embodiment includes the flip-flops, 102 and 104, the resistor 166, and the diode 168. The synchronizer 196 cooperates with the modulus control conductor 126 to provide the synchronizing function, as described previously.

Referring again to FIG. 6, if the dual modulus divider 34 were set so that the normal state were to divide at the higher dividing ratio, rather than normally to divide at the lower dividing ratio, then, in effect, one pulse would be added to the feedback path 16, rather than removed therefrom.

That is, if the dual modulus divider 34 were dividing by a dividing ratio of 21, and then dividing at the ratio of 20 once per second, the frequency in the feedback path 16, as supplied to the phase detector 26, would be increased by one pulse per second; and the phase detector 26 and the integrator 20 would cooperate with the voltage controlled oscillator 22 to reduce the output frequency by one Hertz.

Of course, to obtain an increase in the output frequency as a function of the frequency of the modulation oscillator 64, with the dividing ratios inverted as noted above, would require providing an inverted D.C. modulation voltage to the modulation oscillator 64, while continuing to supply an uninverted D.C. modulation voltage to the resistor 84.

It is important to notice that D.C. modulation of a phase locked loop is achieved in the present invention by either removing pulses from the feedback path 16 or adding pulses to the feedback path 16.

Removal of pulses is achieved by increasing the dividing ratio of the dual modulus divider 34 once for each cycle of the modulation oscillator 64 as shown in FIG. 6, by increasing the dividing ratio a plurality of times for each cycle of the modulation oscillator 64 as shown in FIG. 7, by removing a very large number of pulses from the feedback path 16 when both the prescaling divider 36 is included and one output pulse is eliminated, as shown in FIG. 9, or by removing many pulses from the feedback path 16 by eliminating one output pulse from a circuit in which either the dual modulus divider 34 or the prescaling divider 36 is included.

Removal of pulses, or elimination of pulses, is achieved by preventing a high from passing though the resistor 166 of FIG. 8, thereby removing a pulse by dissipating it through the resistor 166 to a low of the NOT-Q output terminal 174.

Also, removal of pulses is achieved by preventing a low from appearing in the conductor 178 of FIG. 9 by placing a high in the conductor 178 from the output terminal 120, through the diode 168, and into the conductor 178, while isolating the high in the conductor 178 from a low in the conductor 116 by the resistor 166 for one cycle.

Or, stated more broadly, the use of the resistor 166 and the diode 168 prevents a change in the signal level in the feedback path 16.

In FIGS. 4 and 5, the synchronizer 62 is shown symbolically. In the FIG. 6 embodiment, the synchronizer 101 includes the flip-flops 102 and 104, and the OR gate 10. In the FIG. 7 embodiment, the synchronizer 143 includes the flip-flops 102 and 104, the OR gate 106, the AND gate 144, and the inverter 146. In the FIG. 8 embodiment, the synchronizer 184 includes the flip-flops 102 and 164, the resistor 166, and the diode 168. And, in the FIG. 9 embodiment, the synchronizer 196 includes the flip-flops 102 and 104, the resistor 166, and the diode 168.

Referring again to FIG. 4, for purposes of understanding the claims, the following should be observed: The output 27 of the phase detector 26 controls the integrator 20, the integrator 20 controls the VCO 22, and the VCO 22 produces the output frequency in the output conductor 30. Because of this forward progression of control, as opposed to feedback of the output signal from the output conductor 30 to the input 29 of the phase detector 26, as used in the appended claims, the forward path 14 of the phase locked loop 12 includes: the phase detector 26, the integrator 20, the forward path conductor 18, the VCO 22, and the output conductor 30.

In like manner, since the output signal feeds back from the output conductor 30 to the input 29 of the phase detector 26 as a feedback signal, as used in the appended claims, the feedback path 16 includes the feedback conductor 28 and the dual modulus divider 34.

Since the phase detector 26 provides an output which is a function of the difference between the phase angles of the feedback signal to the input 29 and the reference frequency in the input 25, the phase detector 26 is a part of the forward path 14.

It follows that the electrical components of the other embodiments of the present invention can be understood to be a part of the forward path 14, to be a part of the feedback path 16, or to be a part of neither one, in accordance with the flow of signal from the phase detector 26 toward the output conductor 30, or the flow of signal from the output conductor 30 back to the phase detector 26.

For instance, it is evident that the prescaling divider 36 of FIG. 5 is in the feedback path 16. In like manner, referring to FIG. 6, the output conductor 30, the prescaling divider 36, the dual modulus divider 34, and the A and N counters of the variable modulus divider 48 of the integrated chip 42 are a part of the feedback path 16. However, it is obvious that the reference oscillator 44 of the integrated chip 42 is not a part of the forward path 14, nor a part of the feedback path 16; because it is outside the loop 12.

Further, it should be recognized that each of the electrical devices 60, 80, 140, 160, and 190 of FIGS. 4, 5, 7, 8, and 9 includes a phase locking oscillator 70, 90, 154, 180, or 192, respectively, for producing a phase locked output; and each of the electrical devices 60, 80, 140, 160, and 190 of FIGS. 4, 5, 7, 8, and 9 includes a D.C. modulator 72, 92, 156, 182, or 194, respectively, for D.C. modulating the output of the phase locking oscillator 70, 90, 154, 180, or 192, respectively.

Figure 12:
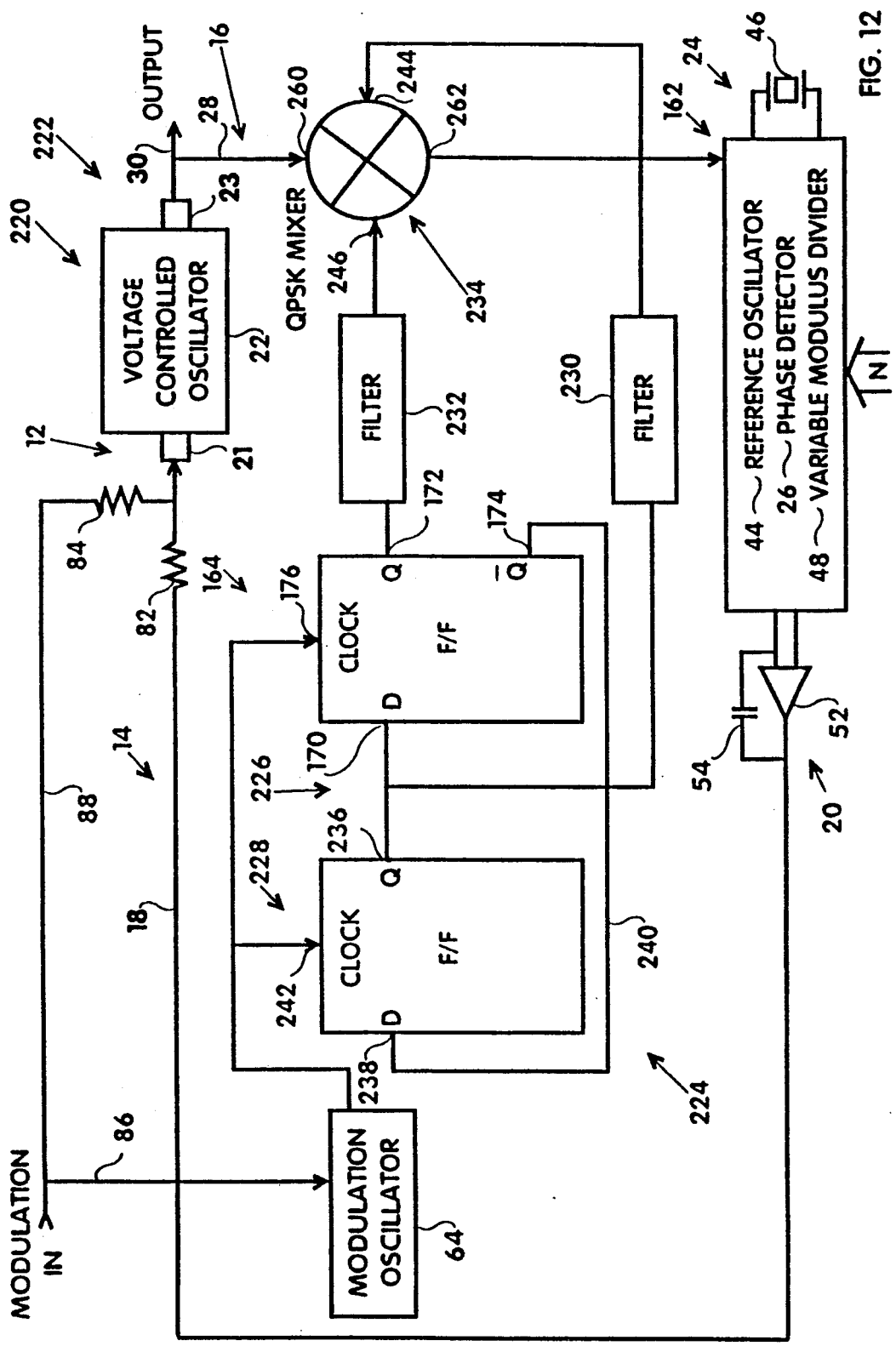
FIG. 12 is a schematic drawing of the present invention in which two flip-flops develop quadrature frequencies from the modulation frequencies, and a quadrature phase shift keying mixer uses one sideband to lower the frequencies in the feedback path.

Referring now to FIG. 12, an electrical device, or D.C. modulated phase locked oscillator, 220 includes a phase locking oscillator 222 and a D.C. modulator 224. The phase locking oscillator 222 includes components generally as named, numbered, and described in conjunction with the embodiment of FIG. 8.

Figure 15:
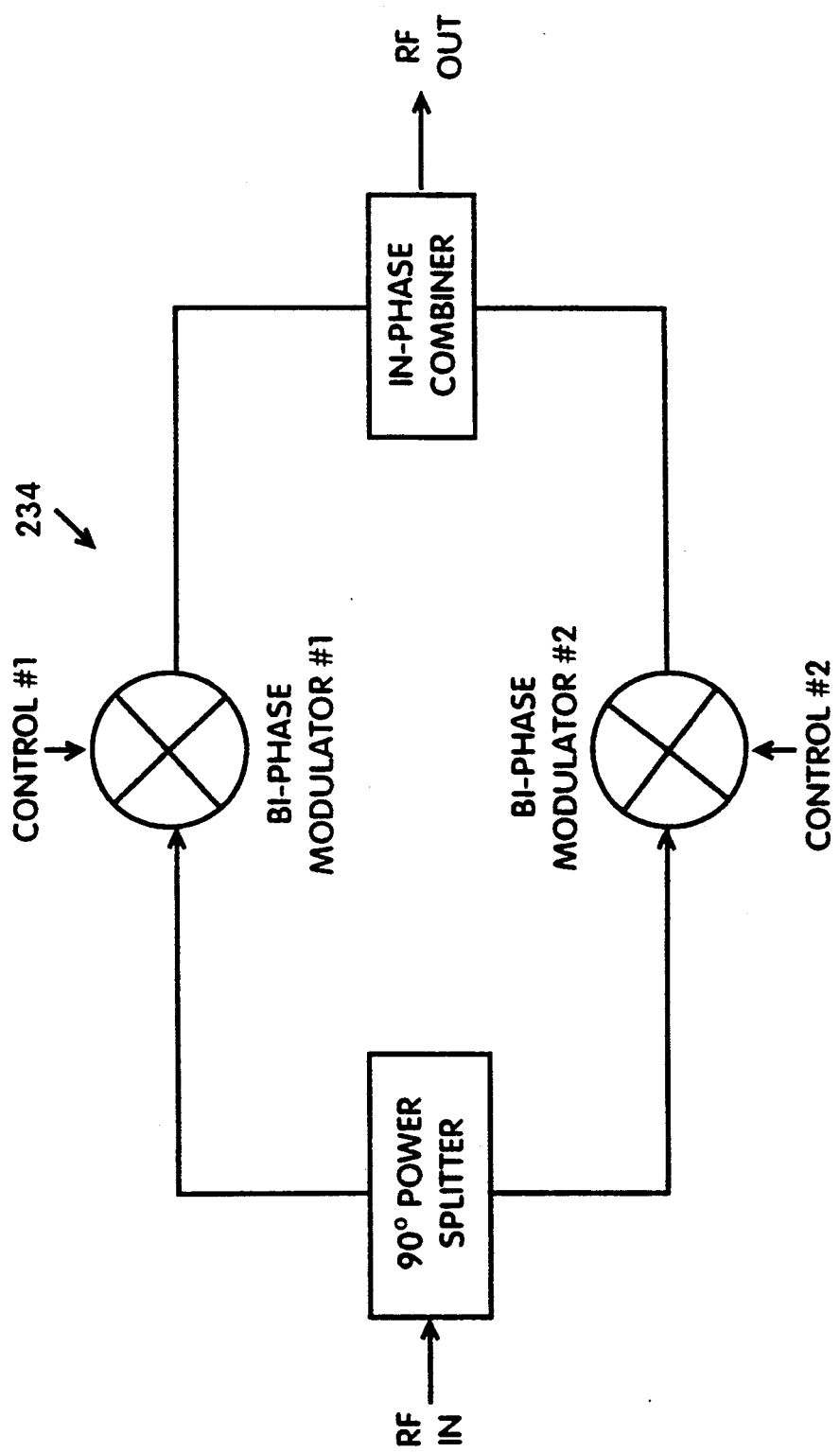
FIG. 15 is a schematic drawing of the quadrature phase shift keying mixer used in the FIG. 12 embodiment.

The D.C. modulator 224 includes the variable modulus divider 48 of the integrated chip 162, the modulation oscillator 64, a quadrature signal generator 226 that includes the flip-flop 164 of FIG. 8 and a first flip-flop, or first logic element, 228 that provides a logic function, filters 230 and 232, and a quadrature phase shift keying mixer (QPSK) 234 which preferably is part number PMQPW-250, manufactured by Mini-Circuits of Brooklyn N.Y., and which is shown in schematic form in FIG. 15.

For the purposes of describing the operation of the flip-flops 164 and 228, initial conditions are assumed as follows: a low at three terminals, namely a Q terminal, or output terminal, 236 of the flip-flop 228, the D input terminal 170 of the flip-flop 164, and the Q output terminal 172; and a high at the NOT-Q output terminal 174 of the flip-flop 164, and a D terminal, or input terminal, 238 of the flip-flop 228 which is connected to the NOT-Q terminal 174 by a conductor 240.

The operation of the flip-flops 164 and 228 can best be understood by considering the states of the various ones of the terminals, 170, 172, 174, 236, and 238 of the flip-flops 164 and 228 prior to, and immediately following the rising edge of, each cycle from the modulation oscillator 64.

Assuming the initial states of the terminals 170, 172, 174, 236, and 238 as noted above, where "0" is a low and "1" is a high, then the leading edge of a particular cycle from the modulation oscillator 64, applied to clock terminals 176 and 242, results in the original states being changed, or remaining the same, as follows:

TABLE 1

| Prior to and Subsequent to 1st Cycle | |
|---|---|
| Flip-flop 228 | |
| D terminal 238 | "1" → "1" |
| Q terminal 236 | "0" → "1" |
| Flip-flop 164 | |
| D terminal 170 | "0" → "1" |
| Q terminal 172 | "0" → "0" |
| NOT-Q terminal 174 | "1" → "1" |

TABLE 2

| Prior to and Subsequent to 2nd Cycle | |
|---|---|
| Flip-flop 228 | |
| D terminal 238 | "1" → "0" |
| Q terminal 236 | "0" → "1" |
| Flip-flop 164 | |
| D terminal 170 | "1" → "1" |
| Q terminal 172 | "0" → "1" |
| NOT-Q terminal 174 | "1" → "0" |

TABLE 3

| Prior to and Subsequent to 3rd Cycle | |
|---|---|
| Flip-flop 228 | |
| D terminal 238 | "0" → "0" |
| Q terminal 236 | "1" → "0" |
| Flip-flop 164 | |
| D terminal 170 | "1" → "0" |
| Q terminal 172 | "1" → "1" |
| NOT-Q terminal 174 | "0" → "0" |

TABLE 4

| Prior to and Subsequent to 4th Cycle | |
|---|---|
| Flip-flop 228 | |
| D terminal 238 | "0" → "1" |
| Q terminal 236 | "0" → "0" |
| Flip-flop 164 | |
| D terminal 170 | "0" → "0" |
| Q terminal 172 | "1" → "0" |
| NOT-Q terminal 174 | "0" → "1" |

From a study of the tables shown above, taken together with the schematic drawing of FIG. 12, it can be seen that one pulse is supplied to the filter 230, and to a first quadrature input terminal 244 of the QPSK mixer 234, when the leading edge of the first cycle is received from the modulation oscillator 64.

Also, from the tables shown above, it can be seen that a second pulse is supplied to the filter 232 and to a second quadrature input terminal 246 of the QPSK mixer 234 when the leading edge of the second cycle is received from the modulation oscillator 64.

Further, it can be seen from the tables shown above that these pulses are supplied to the filters 230 and 232, and to the QPSK mixer 234, only once for each four cycles of the modulation oscilliator 64, and that these two pulses are one cycle apart, the first occurring at the first cycle of the modulation oscilliator 64, and the second occurring at the second cycle of the modulation oscillator 64.

Thus, the flip-flops, 228 and 164, cooperate to divide the frequency of the modulation oscillator 64 by four. Further, since the two pulses from the flip-flops, 228 and 164, are separated by one cycle of the modulation oscillator 64, they are phase shifted by 90 degrees, and the flip-flops, 228 and 164, serve as the quadrature signal generator 226.

Referring now to FIGS. 13a-13c, and to the preceding description that follows Tables 1-4: FIG. 13a is a graph of a modulation frequency 248 of the modulation oscillator 64 that has a period 250; FIG. 13b is a graph of a first square wave 252 that is developed at the Q terminal 236 of the flip-flop 228 in response to the modulation frequency, that has a period 254, and that is delivered to the filter 230 and to the input terminal 244 of the QPSK mixer 234; and FIG. 13c is a graph of a second square wave 256 that is developed at the Q output terminal 172 of the flip-flop 164 in response to the modulation frequency, that has a period of 258, that is phase shifted from the first square wave 252, and that is delivered to the filter 232 and to the input terminal 246 of the QPSK mixer 234.

Thus, as seen in FIGS. 13a-13c, the flip-flops, 228 and 164, of the quadrature signal generator 226 provide square waves, 252 and 256, whose periods, 254 and 258, extend for four of the periods 250 of the modulation frequency 248; and the square wave 256 is shifted in time by one of the periods 250. Further, the frequencies of the square waves, 252 and 256, are one-fourth of the frequency of the modulation frequency 248, and the square waves, 252 and 256 are phase shifted 90 degrees from one another to provide quadrature frequencies.

Therefore, with the QPSK mixer 234 interposed into the feedback conductor 28, with a feedback input terminal 260 and a feedback output terminal 262 connected to the feedback conductor 28, when mixed with frequencies in the feedback path 16, the lower sideband frequency is lower than the feedback frequency by one-fourth of the frequency of the modulation oscillator 64; and, to maintain phase locking, the voltage controlled oscillator 22 increases its frequency by one-fourth of the frequency of the modulation oscillator 64.

Figure 14:
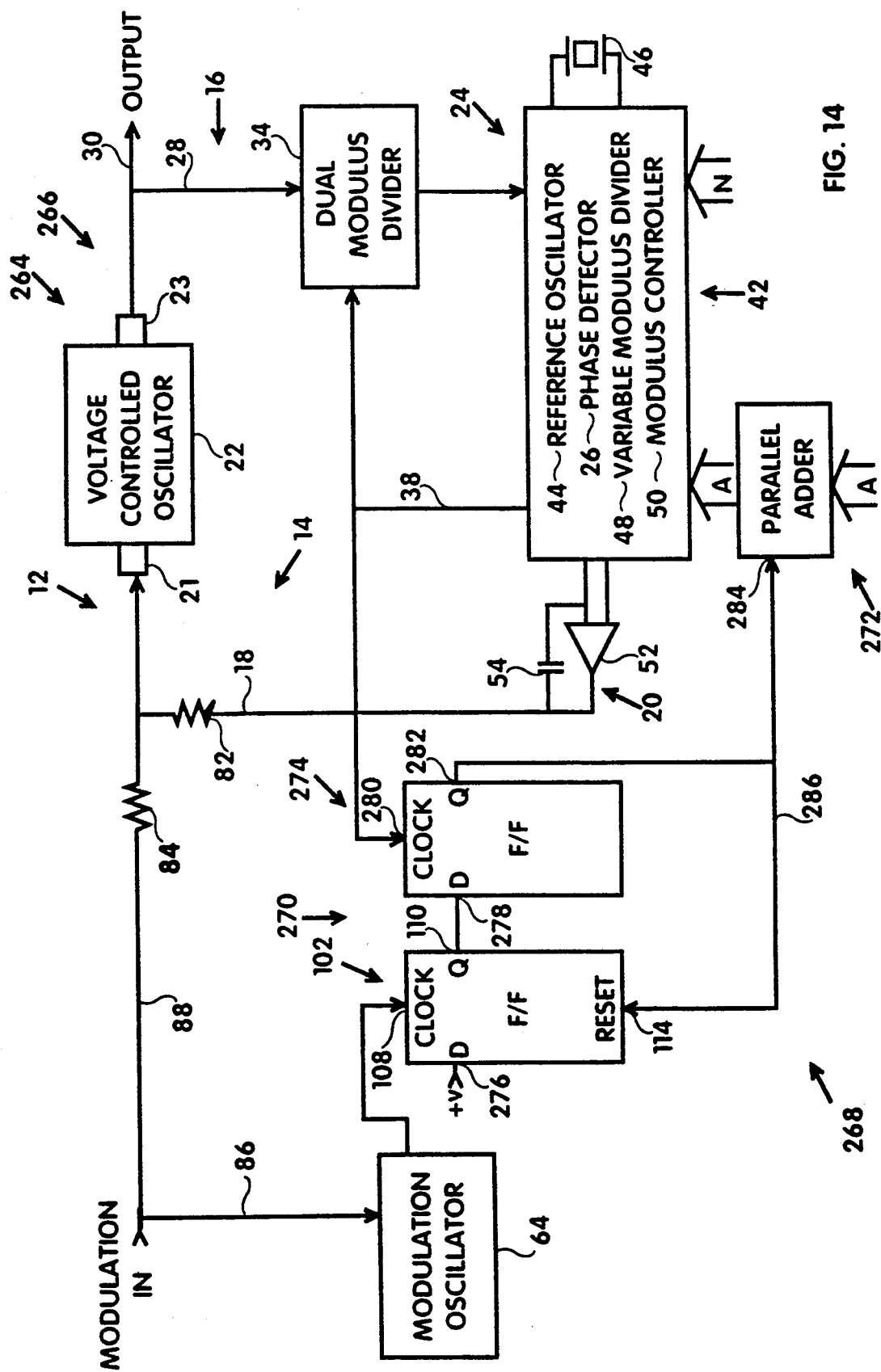
FIG. 14 is a schematic drawing of the present invention in which a parallel adder increases the "A" count of a modulus controller in response to the frequency of a modulation oscillator, adding another division at the "A" ratio, and thereby reducing the frequencies in the feedback path.

Referring now to FIG. 14, an electrical device, or D.C. modulated phase locked oscillator, 264 includes a phase locking oscillator 266 and a D.C. modulator 268. The phase locking oscillator 266 includes components generally as named, numbered and described in conjunction with the embodiment of FIG. 6.

Figure 16:
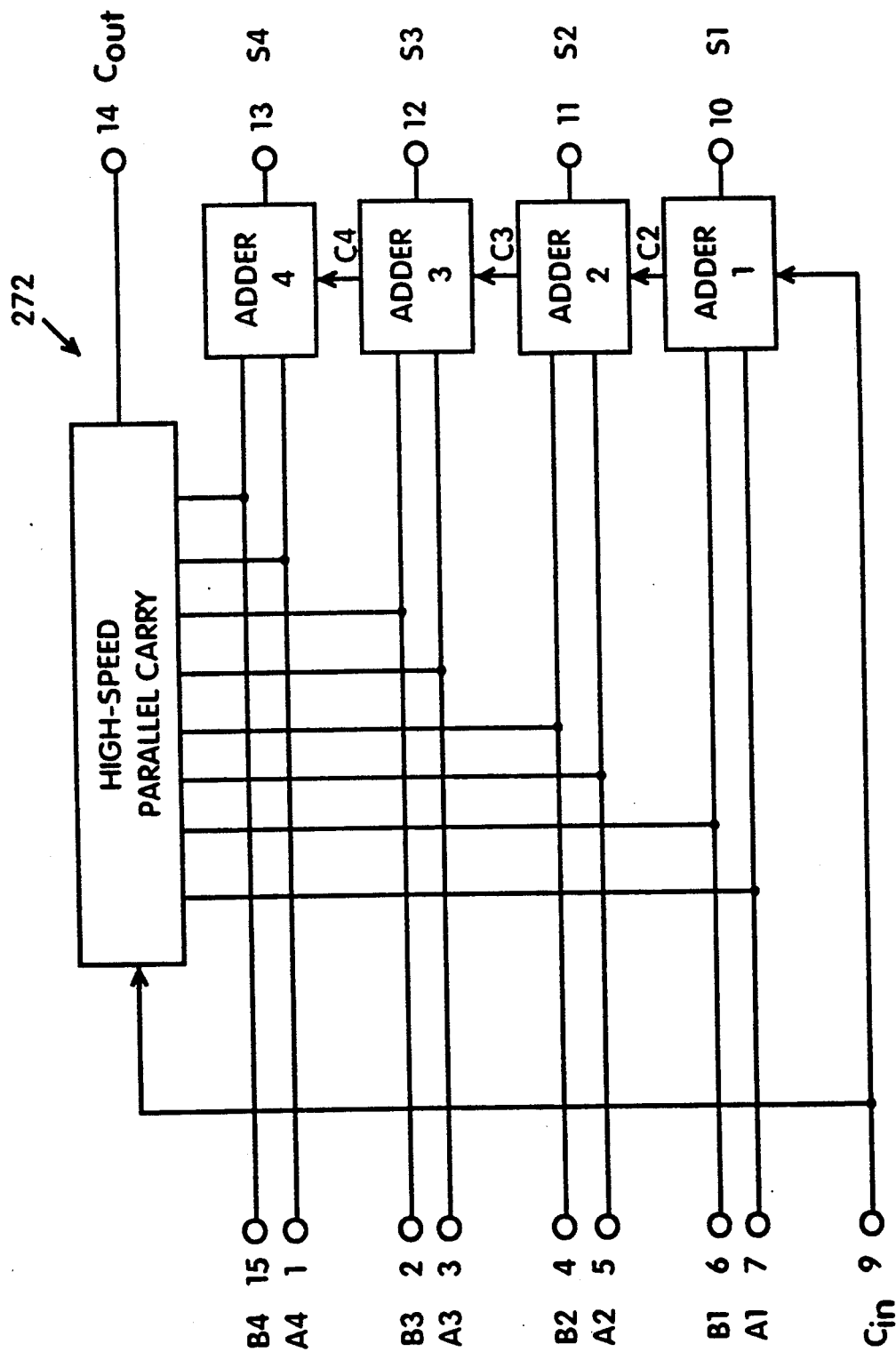
FIG. 16 is a schematic drawing of the parallel adder used in the FIG. 14 embodiment.

The D.C. modulator 268 includes the dual modulus divider 34, the variable modulus divider 48, the modulus controller 50, and the modulation oscillator 64, all as described in conjunction with the embodiment of FIG. 6. In addition, the D.C. modulator 268 includes a synchronizer 270 and a parallel adder 272, the parallel adder 272 being shown in schematic form in FIG. 16. The synchronizer 270 includes both the flip-flop 102 of FIG. 6 and a second flip-flop, or second logic element, 274 that provides a logic function.

In operation, a D terminal, or an input terminal, 276 of the flip-flop 102 is held high by an applied voltage, as shown, so that, when the modulation oscillator 64 delivers a pulse to the clock terminal 108 of the flip-flop 102, the Q terminal 110 of the flip-flop 102 is high and delivers a high to a D terminal, or input terminal, 278 of the flip-flop 274, thereby holding the pulse from the modulation oscillator 64 until the completion of a dividing cycle by the dual modulus divider 34.

Upon completion of a dividing cycle, the modulus controller 50 clocks the flip-flop 274 by delivering the clocking pulse to a clock terminal 280 of the flip-flop 274 via the modulus control conductor 38, thereby producing a high at a Q terminal, or output terminal, 282.

The high at the Q terminal 282 is transmitted to a control terminal 284 of the parallel adder 272 via a conductor 286; and the high at the Q terminal 282 is also transmitted to the reset terminal 114 of the flip-flop 102 via the conductor 286.

With the "A" count of the modulus controller 50 increased by the parallel adder 272, an additional division is performed on the frequency in the feedback path 16, thereby causing the phase detector 26 and the integrator 20 to increase the frequency of the voltage controlled oscillator 22.

Figure 17:
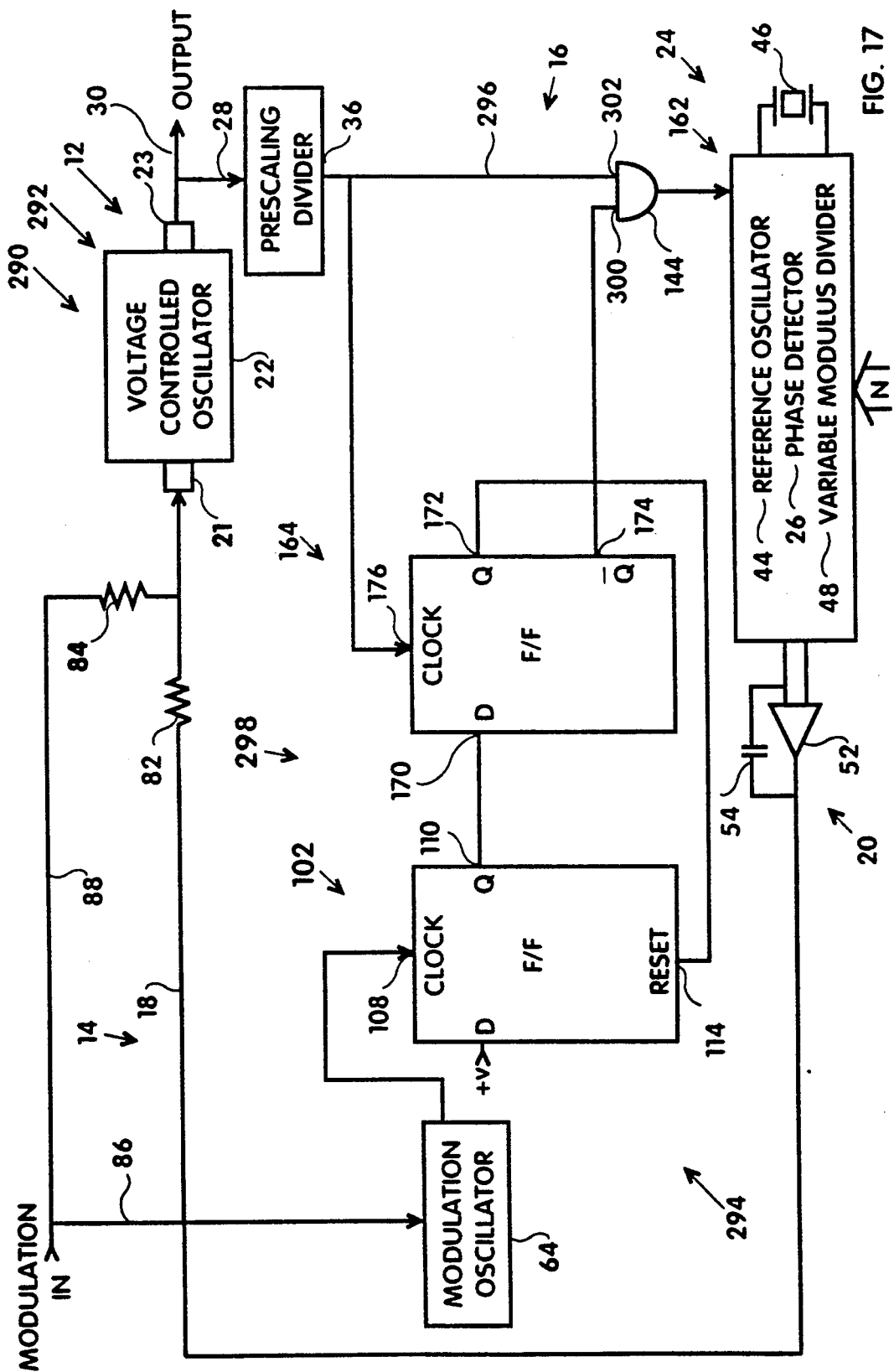
FIG. 17 is a schematic drawing of an embodiment which is similar to the embodiment of FIG. 8, except that the resistor and diode of the FIG. 8 embodiment are replaced with an AND gate, and a prescaling divider is included.

Referring now to FIG. 17, an electrical device, or D.C. modulated phase locked oscillator, 290 includes a phase locking oscillator 292 and a D.C. modulator 294. Generally speaking, the electrical device 290 includes components as named and numbered in conjunction with the FIG. 8 embodiment.

More particularly, the phase locking oscillator 292 includes the reference oscillator 24, consisting of both the reference oscillator 44 and the crystal 46, that provides an input frequency, the phase detector, or comparator, 26, and the phase locked loop 12 that includes both the forward path 14 and the feedback path 16.

The forward path 14 includes the phase detector 26, the integrator 20, the modulation conductor 86, the variable frequency oscillator, or voltage controlled oscillator, 22, and the output conductor 30. The variable frequency oscillator 22 includes both the control input 21 and the output 23.

The feedback path 16 includes the feedback conductor 28, the prescaling divider 36, a feedback conductor 296, the AND gate 144, and the variable modulus divider 48.

The D.C. modulator 294 includes the modulation oscillator 64, the flip-flop 102, the flip-flop 164, and the AND gate 144. A synchronizer 298 includes the flip-flops, 102 and 164, and the AND gate 144. Optionally, for the purpose of D.C. modulating the forward path 14 substantially simultaneously to D.C. modulating the feedback path 16, the D.C. modulator 294 includes the summing resistors 82 and 84.

In operation, when the flip-flop 164 is in its unclocked state, the NOT-Q output is high; and this high is applied to a gate 300 of the AND gate 144. Therefore, as pulses of the feedback frequency in the feedback conductor 296 are applied to a gate 302 of the AND gate 144, the feedback pulses proceed unhindered through the AND gate 144 to the variable modulus divider 48.

Now, it should be recognized that the feedback frequency in the feedback path 16 is much higher than the frequency of the modulation oscillator 64 and that the two frequencies are non-synchronous. Therefore, many pulses of the feedback frequency may pass before the occurrence of a pulse from the modulation oscillator 64.

When the modulation oscillator 64 does produce a pulse, the rising edge of the pulse, as applied to the clock terminal 108, clocks the flip-flop 102 since the D input of the flip-flop 102 is maintained high by a constant voltage, as shown in FIG. 17. As the flip-flop 102 is clocked, its Q terminal, or output terminal, 110 goes high, thereby placing a high on the D input terminal 170 of the flip-flop 164.

The next pulse of the feedback frequency in the feedback conductor 28 is applied to the clock terminal 176 of the flip-flop 164 and clocks the flip-flop 164, thereby making the NOT-Q output low. With the low of the NOT-Q output terminal 174 of the flip-flop 164 applied to the gate 300, that one pulse of the feedback frequency is prevented from going through the AND gate 144. Therefore, the AND gate 144 cooperates with the flip-flops, 102 and 164, to prevent a change in signal level in the feedback path 16 beyond the AND gate 144.

At the same time that the NOT-Q output terminal 174 is made low by clocking of the clock terminal 176 by a pulse in the feedback path 16, this clocking of the flip-flop 164 makes the Q output terminal 172 high. This high at the Q output-terminal 172 is applied to the reset terminal 114 of the flip-flop 102, as shown in FIG. 17. Thus, the flip-flop 102 is reset, making its Q terminal 110 low, making the D input terminal 170 low, and resetting the flip-flop 164.

The result is that only one pulse is removed from the feedback conductor 296 for each pulse of the modulation oscillator 64, and then the flip-flop 102 remains unclocked until the next pulse from the modulation oscillator 64; the flip-flop 164 remains unclocked until the flip-flop 102 is clocked by the modulation oscillator 64; and pulses in the feedback path pass through the AND gate 144 until the occurrence of both the next pulse of the modulation oscillator 64 and a subsequent pulse in the feedback conductor 28.

However, if the prescaling divider 36 divides the feedback frequency in the feedback conductor 28 by thirty, then thirty pulses are removed from the feedback conductor 28 for each cycle of the modulation oscillator 64; and the frequency of the variable frequency oscillator 22 must increase by thirty cycles for each cycle of the modulation oscillator 64.

As described above, the frequency in the feedback path 16 is changed as a function of the modulation frequencies of the modulation oscillator 64. Also, as described above, the synchronizer, 62, 101, 143, 184, 196, 270, or 298, synchronizes the changing of the frequency of the pulses in the feedback path 16 with the pulses in said feedback path 16, whether these pulses are divided by a dual modulus divider 34, as in the embodiments of FIGS. 5, 6, 7, 9, and 14, or whether the frequency in the feedback path is changed by other means, such as in the embodiments of FIGS. 8 or 17.

Therefore, by virtue of this synchronization, the frequency of the pulses in the feedback path 16 is changed, or modulated, by an exact mathematical function of the frequencies of the modulation oscillator. Further, since the phase locked loop 12 is phase locked to the feedback path 16 and to the reference frequency oscillator 24, D.C. modulating of the feedback path 16 by an exact mathematical function of the modulation frequencies results in D.C. modulating the output of the voltage controlled oscillator 22 by an exact mathematical function of the modulation frequencies.

In like manner, the QPSK mixer 234 provides synchronization in mixing the square waves 252 and 254 of the quadrature signal generator 226 with the frequency in the feedback path. Therefore, in the FIG. 12 embodiment also, the frequency of the pulses in the feedback path is changed, or modulated, by an exact mathematical function of the frequencies of the modulation oscillator 64. And this modulation of the feedback path 16, together with phase locking of the phase locked loop 12, results in the output of the variable frequency oscillator 22 being D.C. modulated by an exact mathematical function of the modulation frequencies.

A frequency is provided to the feedback path 16 by the output frequency. As used in the preceding description and in the claims, the feedback frequency is a pulsed signal having pulses whose frequency is proportional to the output frequency. That is, the frequency of the pulses at a given point in the feedback path 16 is dependent upon whatever components, such as dividers, are located between the output frequency and the given point in the feedback path 16.

In the preceding descriptions of the various embodiments, not every element, nor every part of every element, has been described in conjunction with a particular embodiment. The reader should understand that, where the same numbers are shown in various drawings, the elements, and parts thereof, are the same as like-numbered parts which are described in conjunction with any other embodiment.

While the present invention has been described with particular components, it should be understood that the scope of the present invention is to be determined by the terminology used in the claims, and by the functions recited therein, without regard to more specifically described components in the detailed description.

Further, while examples have been given for frequencies, it should be understood that the present invention will function as described, and is useful in the gigahertz range, in the megahertz range, in the kilohertz range, and below the kilohertz range. For this reason, frequency limiting terms, such as radio frequency, are not needed, nor included, in the claims.

While specific apparatus and method have been disclosed in the preceding description, and while part numbers have been inserted parenthetically into the claims to facilitate understanding of the claims, it should be understood that these specifics have been given for the purpose of disclosing the principles of the present invention and that many variations thereof will become apparent to those who are versed in the art. Therefore, the scope of the present invention is to be determined by the appended claims, and without any limitation by the part numbers inserted parenthetically in the claims.

INDUSTRIAL APPLICABILITY

The present invention is applicable to phase locked oscillators, voltage controlled crystal oscillators, single frequency transmitters, channelized transmitters, telemetry and video transmitters such as are used for commercial, consumer, and military products, and to all such electrical devices in which low frequency drift, inclusion of a maximum number of channels within a limited frequency range, large frequency deviations, and/or rapid synchronization to modulation frequencies are/is required, whether the output frequencies be in the gigahertz range, in the megahertz range, in the kilohertz range, or even lower than the kilohertz range.

What is claimed is:

1. An electrical device (80, 100, 140, 160, 190, 220, 264, or 290) which comprises phase locking oscillator means (90, 128, 154, 180, 192, 222, 266, or 292), having a loop (12) with a forward path (14) that includes a comparator (26) and a variable frequency oscillator (22) that is operatively connected to said comparator, and with a feedback path (16) that feeds pulses of a feedback frequency from said variable frequency oscillator back to said comparator, for producing an output that is phase locked to an input frequency, the improvement which is characterized by:
    a source (64) of modulation frequencies;
    D.C. modulator means (92, 130, 156, 182, 194, 224, 268, or 294), being operatively connected to said source of modulation frequencies and to said feedback path, for changing the frequency of said pulses in said feedback path as a function of the frequencies of said source of modulation frequencies; and
    means, comprising said D.C. modulator means, for D.C. modulating said output by an exact mathematical function of said modulation frequencies.

2. An electrical device (100, 140, 160, 190, 220, 264, or 290) which comprises phase locking oscillator means (128, 154, 180, 192, 222, 266, or 292), having a loop (12) with a forward path (14) that includes a comparator (26) and a variable frequency oscillator (22) that is operatively connected to said comparator, and with a feedback path (16) that feeds pulses of a feedback frequency from said variable frequency oscillator back to said comparator, for producing an output that is phase locked to an input frequency, the improvement which is characterized by:
    a source (64) of modulation frequencies;
    D.C. modulator means (130, 156, 182, 194, 224, 268, or 294), being operatively connected to said source of modulation frequencies and to said feedback path, for changing the frequency of said pulses in said feedback path as a function of the frequencies of said source of modulation frequencies; and
    said electrical device comprises means (48), being operatively connected to said feedback path, for channelizing said feedback frequency.

3. An electrical device (100, 140, 160, 190, 220, or 290) as claimed in claim 1 in which said electrical device comprises means (48), being operatively connected to said feedback path (16), for channelizing said feedback frequency.

4. An electrical device (100, 140, 160, 190, 220, 264, or 290) as claimed in claim 1 in which said D.C. modulator means (92, 130, 156, 182, 194, 224, 268, or 294) comprises means (34, 144, 166, and/or 234) for removing pulses from said feedback path as a function of said frequencies of said source (64) of modulation frequencies.

5. An electrical device (100, 140, 190, or 264) as claimed in claim 1 in which said D.C. modulator means (92, 130, 156, 182, 194, 224, 268, or 294) comprises means (34) for adding pulses to said feedback path as a function of said frequencies of said source (64) of modulation frequencies.

6. An electrical device (160, 190, or 290) as claimed in claims 1 or 2 in which said D.C. modulator means (92, 130, 156, 182, 194, 224, 268, or 294) comprises means (144 or 166) for preventing a change in signal level of said pulses in said feedback path as a function of said frequencies of said source (64) of modulation frequencies.

7. An electrical device (160 or 190) as claimed in claims 1 or 2 in which said D.C. modulator means (92, 130, 156, 182, 194, 224, 268, or 294) comprises means, including a resistor (166), for resistively preventing a change in signal level of said pulses in said feedback path as a function of said frequencies of said source (64) of modulation frequencies.

8. An electrical device (100, 140, 190, or 264) as claimed in claims 1 or 2 in which said D.C. modulator means (92, 130, 156, 182, 194, 224, 268, or 294) comprises means, including a dual modulus divider (34) with higher and lower dividing ratios that is interposed into said feedback path and that is operatively connected to said source (64) of modulation frequencies, for dividing said feedback frequency by one of said dividing ratios as a function of said modulation frequencies.

9. An electrical device (100, 140, 160, 190, 220, 264, or 290) as claimed in claims 1 or 2 in which said operative connection of said D.C. modulator means (130, 156, 182, 194, 224, 268, or 294) to said source (64) of modulation frequencies and to said feedback path (16) comprises a first flip-flop (102 or 228) that is operatively connected to said source of modulation frequencies, and a second flip-flop (104, 164, or 274) that is operatively connected to said first flip-flop and to said feedback path.

10. An electrical device (140) as claimed in claims 1 or 2 in which said D.C. modulator means (156) comprises a shift register (142); and
said operative connection of said D.C. modulator means to said source (64) of modulation frequencies comprises said shift register.

11. An electrical device (160 or 190) as claimed in claims 1 or 2 in which said D.C. modulator means (182 or 194) comprises a resistor (166) that is interposed into said feedback path (16) and a diode (168) that is operatively connected to said resistor; and
said operative connection of said D.C. modulator means to said source (64) of modulation frequencies comprises said diode.

12. An electrical device (140 or 290) as claimed in claims 1 or 2 in which said operative connection of said D.C. modulator means (156 or 294) to said source (64) of modulation frequencies and to said feedback path (16) comprises synchronizer means (143 or 298), having first (102) and second (104 or 164) flip-flops and an AND gate (144), for synchronizing said changing of said frequency of said pulses in said feedback path with said pulses in said feedback path.

13. An electrical device (100 or 140) as claimed in claims 1 or 2 in which said operative connection of said D.C. modulator means (130 or 156) to said source (64) of modulation frequencies and to said feedback path (16) comprises synchronizer means (101 or 143), having first (102) and second (104) flip-flops and an OR gate (106), for synchronizing said changing of said frequency of said pulses in said feedback path with said pulses in said feedback path.

14. An electrical device (220) as claimed in claims 1 or 2 in which said D.C. modulator means (224) comprises:
a quadrature phase shift keying mixer (234) that is interposed into said feedback path (16); and
a quadrature signal generator (226) that is operatively connected to said source (64) of modulation frequencies and to said quadrature phase shift keying mixer.

15. An electrical device (264) as claimed in claims 1 or 2 in which said D.C. modulator means (268) comprises:
a dual modulus divider (34) that is interposed into said feedback path (16);
a variable modulus divider (48) that is interposed into said feedback path and that includes both A and N inputs; and
a parallel adder (272) that is operatively connected to said source (64) of modulation frequencies and to one of said inputs of said variable modulus divider.

16. An electrical device (100, 140, 190, or 264) as claimed in claim 1 in which said D.C. modulator means (92, 130, 156, 182, 194, 224, 268, or 294) comprises means, including a dual modulus divider (34) with higher and lower dividing ratios that is interposed into said feedback path and that is operatively connected to said source (64) of modulation frequencies, for dividing said feedback frequency by one of said dividing ratios as a function of said modulation frequencies; and
said device includes means (48) for controlling said dividing ratios separate from said modulation frequencies.

17. An electrical device (100, 140, 160, 190, 220, or 264) as claimed in claim 1 in which said electrical device comprises:
means (48) for channelizing said feedback frequency; and
means (50) for preventing interference between said D.C. modulator means (130, 156, 182, 194, 224, or 268) and said channelizing means.

18. A method for producing a phase locked output that is D.C. modulated, which method comprises providing an input frequency, using said input frequency to generate an output frequency, using said output frequency to provide a feedback frequency, comparing said feedback frequency with said input frequency, and using said comparison to phase lock said output frequency to said input frequency, the improvement which is characterized by:
a) accessing a modulation frequency;
b) using said modulation frequency to D.C. modulate said feedback frequency; and
c) changing said output frequency as an exact mathematical function of said modulation frequency.

19. A method for producing a phase locked output that is D.C. modulated, which method comprises providing an input frequency, using said input frequency to generate an output frequency, using said output frequency to provide a feedback frequency, comparing said feedback frequency with said input frequency, and using said comparison to phase lock said output frequency to said input frequency, the improvement which is characterized by:
a) accessing a modulation frequency;
b) using said modulation frequency to D.C. modulate said feedback frequency; and
c) channelizing said feedback frequency.

20. A method as claimed in claim 18 in which said method further comprises channelizing said feedback frequency.

21. A method as claimed in claim 18 in which said D.C. modulating of said feedback frequency comprises:
a) developing a quadrature frequency that is a function of said modulation frequency; and
b) mixing said quadrature frequency with said feedback frequency.

22. A method as claimed in claim 18 in which:
said step of using said output frequency to provide said feedback frequency comprises using said output frequency to provide a pulsed signal whose pulses have a frequency proportional to said output frequency; and
said D.C. modulating of said feedback frequency comprises removing pulses from said pulsed signal.

23. A method as claimed in claim 18 in which:
said step of using said output frequency to provide said feedback frequency comprises using said output frequency to provide a pulsed signal whose pulses have a frequency proportional to said output frequency; and
said D.C. modulating of said feedback frequency comprises adding pulses to said pulsed signal.

24. A method as claimed in claims 18 or 19 in which:

said step of using said output frequency to provide said feedback frequency comprises using said output frequency to provide a pulsed signal whose pulses have a frequency proportional to said output frequency; and said D.C. modulating of said feedback frequency comprises preventing a change in signal level of said pulsed signal as a function of said modulation frequency.

25. A method as claimed in claims 18 or 19 in which:
said step of using said output frequency to provide said feedback frequency comprises using said output frequency to provide a pulsed signal whose pulses have a frequency proportional to said output frequency; and said D.C. modulating of said feedback frequency comprises resistively preventing a change in signal level in said pulsed signal as a function of said modulation frequency.

26. A method as claimed in claims 18 or 19 in which said D.C. modulating of said feedback frequency comprises dividing said feedback frequency by one of two dividing ratios as an exact mathematical function of said modulation frequency.

27. A method as claimed in claims 18 or 19 in which said D.C. modulating of said feedback frequency comprises dividing said feedback frequency by one of two dividing ratios as an exact mathematical function of said modulation frequency; and said method further comprises dividing said feedback frequency by a selectively variable modulus.

28. A method as claimed in claim 18 in which said method comprises channelizing said feedback frequency; and said method further comprises preventing interference between said D.C. modulating and said channelizing steps.

29. A method as claimed in claims 18 or 19 in which said D.C. modulating of said feedback frequency comprises:
a) using said modulation frequency to clock a first logic function; and
b) using said feedback frequency to clock a second logic function.

30. A method as claimed in claims 18 or 19 in which said D.C. modulating of said feedback frequency comprises:
a) using said modulation frequency to clock a first logic function; and
b) using the output of a second logic function to reset said first logic function.

31. A method as claimed in claims 18 or 19 in which said method further comprises:
a) dividing said feedback frequency by variable moduli that are selectable by control of A and N inputs;
b) controlling one of said inputs with said modulation frequency; and
c) increasing the effectiveness of said modulation frequency to control said one input.

32. A method as claimed in claims 18 or 19 in which both said feedback frequency and said modulation frequency comprise pulses, and said D.C. modulating of said feedback frequency comprises:
a) providing a logic input in the absence of a pulse of said modulation frequency;
b) using said logic input in AND logic to allow pulses of said feedback frequency to be used in said comparing step; and
c) periodically obviating said logic input as a function of pulses of said modulation frequency.

33. A method as claimed in claim 18 in which said D.C. modulating of said feedback frequency comprises dividing said feedback frequency by higher and lower dividing ratios;
said method comprises dividing said feedback frequency by selectively variable moduli; and
said method further comprises preventing interference between said dividing steps.

34. A method as claimed in claims 18 or 19 in which both said feedback frequency and said modulation frequency comprise pulses, and said D.C. modulating of said feedback frequency comprises:
a) providing a logic high that is external to said feedback frequency in the absence of a pulse of said modulation frequency;
b) preventing said logic high from being imposed upon said feedback frequency;
c) changing said logic high to a logic low as a function of pulses of said modulation frequency; and
d) allowing said logic high in said feedback frequency to be dissipated by said logic low.

35. An electrical device (80, 100, 140, 160, 190, 220, 264, or 290) as claimed in claims 1 or 2 in which said D.C. modulator means (92, 130, 156, 182, 194, 224, 268, or 294) comprises means (84), being operatively connected to said forward path, for modulating said forward path.

36. A method as claimed in claims 18 or 19 in which said method further comprises modulating said output frequency in addition to said D.C. modulating of said feedback frequency.

* * * * *

UNITED STATES PATENT AND TRADEMARK OFFICE
CERTIFICATE OF CORRECTION

PATENT NO.  : 5,311,152
DATED       : 10 May 1994
INVENTOR(S) : Lloyd L. Lautzenhiser Page 1 of 2

It is certified that error appears in the above-indentified patent and that said Letters Patent is hereby corrected as shown below:

The Abstract should be replaced with the Abstract as amended in the PCT, which is as follows: --A D.C. modulated phase locked oscillator (60, 80, 100, 140, 160, 190, 220, 264, or 290) includes a phase locking oscillator (70, 90, 128, 180, 192, 222, 266, or 292) and a D.C. modulator (72, 92, 130, 156, 182, 194, 224, 268, or 294). A feedback path (16) is D.C. modulated, and a forward path (14) with a voltage controlled oscillator (22) is modulated. Synchronization of D.C. modulation of the feedback path (16) with the feedback frequency results in modulation of the feedback path (16) by an exact mathematical function of the modulation frequencies; and since the system phase locks, the output of the voltage controlled oscillator is also modulated by an exact mathematical function of the modulation frequencies. D.C. modulation of the feedback path (16) optionally includes removing or adding pulses, changing the feedback frequency by a plurality of pulses for each cycle of the modulation oscillator (64), dividing the feedback frequency by higher and lower dividing ratios, preventing one cycle in the feedback path (16) from occurring, mixing quadrature frequencies with the feedback frequency, using a parallel adder (272) to change one input to a variable modulus divider (48), and using logic elements (148) to remove pulses from the feedback path (16).--

In column 1, "non-linearities" should be --nonlinearities-- in line 56. In column 3, "th RF" should be --the RF-- in line 31. In column 4, "mid point" should be --midpoint-- in line 9. In column 7, "included" should be --includes-- in lines 3 and 4. In column 10, "prescalling" should be

UNITED STATES PATENT AND TRADEMARK OFFICE
CERTIFICATE OF CORRECTION

PATENT NO. : 5,311,152
DATED : 10 May 1994
INVENTOR(S) : Lloyd L. Lautzenhiser

It is certified that error appears in the above-indentified patent and that said Letters Patent is hereby corrected as shown below:

--prescaling-- in line 14; and "modulated" should be --modulated,-- in line 42 In column 12, "should b" should be --should be-- in line 55. In column 15, "320" should be --320,-- in line 57. In column 17, "though" should be --through-- in line 22. In column 21, "non-synchronous" should be --nonsynchronous-- in line 50.

Signed and Sealed this

Sixth Day of June, 1995

Attest:

BRUCE LEHMAN

Attesting Officer   Commissioner of Patents and Trademarks